United States Patent
Kim et al.

(10) Patent No.: US 10,388,550 B2
(45) Date of Patent: Aug. 20, 2019

(54) METHOD FOR DETECTING THE CENTER OF SUBSTRATE, METHOD FOR TRANSPORTING A SUBSTRATE, TRANSPORTING UNIT AND APPARATUS FOR TREATING A SUBSTRATE INCLUDING THE UNIT

(71) Applicant: SEMES CO., LTD., Chungcheongnam-do (KR)

(72) Inventors: Duk Sik Kim, Chungcheongnam-do (KR); Hyun Jun Kim, Busan (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 211 days.

(21) Appl. No.: 15/274,321

(22) Filed: Sep. 23, 2016

(65) Prior Publication Data

US 2017/0092520 A1 Mar. 30, 2017

(30) Foreign Application Priority Data

Sep. 25, 2015 (KR) .................. 10-2015-0136079

(51) Int. Cl.
*H01L 21/67* (2006.01)
*H01L 23/544* (2006.01)
(Continued)

(52) U.S. Cl.
CPC ...... *H01L 21/67259* (2013.01); *H01L 21/677* (2013.01); *H01L 21/681* (2013.01);
(Continued)

(58) Field of Classification Search
CPC ......... H01L 21/67259; H01L 21/68707; H01L 21/681; H01L 23/544; H01L 2223/54493
See application file for complete search history.

(56) References Cited

U.S. PATENT DOCUMENTS

| 6,198,976 B1 * | 3/2001 | Sundar | .................. | H01L 21/681 700/121 |
| 7,311,738 B2 * | 12/2007 | Kitayama | ............. | H01L 21/682 257/E21.521 |

(Continued)

FOREIGN PATENT DOCUMENTS

| CN | 102169822 A | 8/2011 |
| CN | 103811387 A | 5/2014 |

(Continued)

OTHER PUBLICATIONS

Notice of Allowance for corresponding Korean Application No. 10-2015-0136079 dated Jun. 28, 2017.

(Continued)

*Primary Examiner* — Mohammad K Islam
(74) *Attorney, Agent, or Firm* — Carter, Deluca & Farrell LLP

(57) ABSTRACT

A method for detecting a center of substrate, for transporting a substrate, a substrate transporting unit, and a substrate treating apparatus are provided. The substrate center detecting method includes detecting four edge positions of the substrate, judging whether a notch exists among the four edge positions or not, moving the substrate when there is a notch among the four edge positions, and calculating a center of the substrate, wherein the calculating includes re-detecting four edge positions of the substrate, calculating a first midpoint of the substrate using three edge positions out of the four edge positions of the substrate detected in the detecting, calculating a second midpoint of the substrate using three edge positions out of the four edge positions of the substrate detected in the re-detecting, and determining a real midpoint of the substrate based on moving status of the first and second midpoints of the substrate.

18 Claims, 24 Drawing Sheets

(51) Int. Cl.
  *H01L 21/677* (2006.01)
  *H01L 21/68* (2006.01)
  *H01L 21/687* (2006.01)

(52) U.S. Cl.
  CPC ...... *H01L 21/68707* (2013.01); *H01L 23/544* (2013.01); *H01L 2223/54493* (2013.01)

(56) References Cited

U.S. PATENT DOCUMENTS

| | | | |
|---|---|---|---|
| 9,831,110 B2* | 11/2017 | Francken | G06T 7/0004 |
| 2001/0006571 A1* | 7/2001 | Miura | G01N 21/9501 |
| | | | 385/52 |
| 2006/0222236 A1* | 10/2006 | Osada | G03F 9/7011 |
| | | | 382/151 |
| 2008/0013089 A1* | 1/2008 | Ishii | G03F 9/7011 |
| | | | 356/400 |
| 2010/0024723 A1* | 2/2010 | Hasegawa | H01J 37/32743 |
| | | | 118/500 |
| 2011/0235054 A1* | 9/2011 | Koike | B25J 9/1697 |
| | | | 356/620 |
| 2012/0257176 A1* | 10/2012 | Hayashi | H01L 21/67259 |
| | | | 355/27 |
| 2013/0085595 A1* | 4/2013 | Kiley | H01L 21/681 |
| | | | 700/121 |
| 2013/0202388 A1* | 8/2013 | Hayashi | H01L 21/677 |
| | | | 414/222.02 |
| 2013/0204421 A1* | 8/2013 | Hayashi | H01L 21/67259 |
| | | | 700/112 |
| 2014/0007669 A1* | 1/2014 | Akada | G01P 13/0006 |
| | | | 73/170.01 |
| 2014/0124479 A1* | 5/2014 | Tomita | H01L 21/02087 |
| | | | 216/85 |
| 2015/0287625 A1* | 10/2015 | Fujimoto | G01B 11/002 |
| | | | 382/151 |
| 2015/0369583 A1* | 12/2015 | Potter, Sr. | H01L 21/67259 |
| | | | 702/150 |
| 2016/0240412 A1* | 8/2016 | Kodama | G01V 8/20 |
| 2016/0351425 A1* | 12/2016 | Kim | H01L 21/67259 |

FOREIGN PATENT DOCUMENTS

| | | |
|---|---|---|
| JP | 200293786 A | 3/2002 |
| JP | 2002-319612 A | 10/2002 |
| JP | 2003-254738 A | 9/2003 |
| JP | 2008-218903 A | 9/2008 |
| KR | 10-2003-0046317 A | 6/2003 |
| KR | 10-2010-0026743 A | 3/2010 |
| KR | 10-1023948 B1 | 3/2011 |
| KR | 10-1524335 B1 | 5/2015 |

OTHER PUBLICATIONS

Chinese Office Action dated Oct. 29, 2018 in corresponding Chinese Patent Application No. 201610850986.0 with English translation.

* cited by examiner

METHOD FOR DETECTING THE CENTER OF SUBSTRATE, METHOD FOR TRANSPORTING A SUBSTRATE, TRANSPORTING UNIT AND APPARATUS FOR TREATING A SUBSTRATE INCLUDING THE UNIT

CROSS-REFERENCE TO RELATED APPLICATIONS

A claim for priority under 35 U.S.C. § 119 is made to Korean Patent Application No. 10-2015-0136079 filed on Sep. 25, 2015 in the Korean Intellectual Property Office, the entire contents of which are hereby incorporated by reference.

BACKGROUND OF THE INVENTION

The present invention disclosed herein relates to method for detecting the center of substrate by detecting edge position of a substrate, method for transporting a substrate based on calculated amount of position dislocation of the substrate supported on a transporting unit when transporting the substrate by the transporting unit, and a transporting unit for transporting a substrate and a substrate treating apparatus including the transporting unit.

Photo-lithography process in a semiconductor manufacturing process is to form a desired pattern on a wafer. Generally, photo-lithography process is carried out by a spinner local equipment, which is connected with an exposure equipment and conducts continuously a deposit process, an exposure process, and a developing process. This spinner local equipment performs sequentially or selectively a deposit process, a bake process, and a developing process.

These processes are performed sequentially in a plurality of process chambers. A substrate treating process, when a process is completed in one process chamber, transfers the substrate from the one process chamber to the another process chamber by using a separate substrate transporting unit and performs a substrate treating process in the another process chamber.

However, when transferring the substrate, the substrate may be supported on transferring unit at un-right position.

Therefore, before transferring the substrate, it is checked if the substrate is placed on the right position.

Generally, whether a substrate is on the right position or not could be determined by calculating a center position of the substrate as placed and comparing the calculated center position with a reference center position. However, calculated midpoint of substrate based on detecting a position on a substrate and detecting notch position at the same time becomes different midpoint from a real midpoint of a substrate and cannot determine whether it is placed on home point or not and has a problem of checking the amount of dislocation of a substrate and transporting it.

SUMMARY OF THE INVENTION

The present invention provides a method for detecting a center of a substrate placed on a transporting unit when transporting the substrate.

Also, the present invention provides a method for transporting a substrate to a target position by calculating the amount of dislocation of the substrate placed on transporting unit when transporting the substrate.

Also, the present invention relates to a transporting unit capable of transporting a substrate to a target position by calculating a center of the substrate and a substrate treating apparatus including the transporting unit.

The present invention is not limited herein, and other purposes that are not mentioned will be understandable by those skilled in the art from the following descriptions.

According to an embodiment of the present invention, a method for detecting a center of a substrate comprises: a first position detecting step that detects four edge positions of a substrate; a notch existence judging step whether a notch exists among the detected four edge positions or not; a substrate moving step that moves the substrate when there is a notch among the detected four edge positions; a center calculating step that calculates a center of the substrate; wherein the center calculating step comprises: a second detecting step that re-detects four edge positions of the substrate; a first midpoint calculating step that calculates a first midpoint of the substrate using three edge positions out of four edge positions of the substrate detected in the first position detecting step; a second midpoint calculating step that calculates a second midpoint of the substrate using three edge positions out of four edge positions of the substrate detected in the second position detecting step; a first determining step that determines a real midpoint of the substrate based on moving status of the first midpoint of the substrate and the second midpoint of the substrate.

According to an embodiment of the present invention, a substrate transporting method comprising: a substrate center calculating step that calculates a center of a substrate; a dislocation amount calculating step that calculates the amount of dislocation of the substrate by comparing the reference center of the substrate and a center of the substrate obtained in the substrate center calculating step; and a substrate transporting step that transports the substrate by correcting transporting position of the substrate e based on the amount of dislocation of the substrate obtained in the dislocation amount calculating step, wherein the substrate center detecting step comprises: a first position detecting step that detects four edge positions of the substrate; a notch existence judging step that judges whether a notch exists among the detected four edge positions or not; a substrate moving step that moves the substrate when there is a notch among the four edge positions; and a center calculating step that calculates a center of the substrate, wherein the center calculating step comprises: a second detecting step that re-detects four edge positions of the substrate; a first midpoint calculating step that calculates a first midpoint of the substrate by using three edge positions out of four edge positions of the substrate detected in the first position detecting step; a second midpoint calculating step that calculates a second midpoint of the substrate by using three edge positions out of four edge positions of the substrate detected in the second position detecting step; a first determining step that determines a real midpoint of the substrate based on moving status of the first and second midpoints of the substrate.

According to an embodiment of the present invention, a substrate transporting unit comprising: a base; a transfer arm installed on the base and supports a substrate; a position detecting member that detects four edge positions of the substrate supported by the transfer arm; and a controller that detects a center of the substrate by using the four edge positions detected by the position detecting member, wherein the controller controls to performs: a first position detecting step that detects four edge positions of a substrate; a notch existence judging step that judges whether a notch exists among the detected four edge positions or not; a substrate moving step when there exists a notch among the detected four edge positions; and a center calculating step that calculates a center of the substrate, wherein the center calculating step comprises: a second detecting step that re-detects four edge positions of the substrate; a first midpoint calculating step that calculates a first midpoint of the substrate using three edge positions out of four edge positions of the substrate detected in the first position detecting step; a second midpoint calculating step that calculates a second midpoint of the substrate using three edge positions out of four edge positions of the substrate detected in the second position detecting step; a first determining step that determines a real midpoint of the substrate based on moving status of the first and second midpoints of the substrate.

According to an embodiment of the present invention, a substrate treating apparatus comprising: a transporting chamber provided with a transporting unit that transports a substrate; and one or a plurality of transporting chambers that surround the transporting chamber, wherein the transporting unit comprises: a base; a transfer arm installed on the base and supports the substrate; a position detecting member that detects four edge positions of the substrate supported by the transfer arm, and a controller that detects a center of the substrate by using the four edge positions detected by the position detecting member and controls the transfer arm as to transfer the substrate by calculating amount of dislocation of the substrate based on the center of the substrate and correcting a transporting position of the substrate, wherein the controller performs: a center detecting step that calculates a center of the substrate; a dislocation amount calculating step that calculates the amount of dislocation of the substrate by comparing the reference center of the substrate and a center of the substrate obtained in the center calculating step; a substrate transporting step that transports the substrate by correcting transporting position of the substrate based on the amount of dislocation of the substrate obtained in the dislocation amount calculating step, wherein the first center detecting step comprises; a first position detecting step that detects four edge positions of the substrate; a notch existence judging step that judges whether a notch exists among the detected four edge positions or not; a substrate moving step that moves the substrate when there exists a notch among the detected four edge positions; and a center calculating step that calculates a center of the substrate, wherein the center calculating step comprises: a second detecting step that re-detects four edge positions on a substrate; a first midpoint calculating step that calculates first midpoint of the substrate using three edge positions out of the four edge positions of the substrate detected in the first position detecting step; a second midpoint calculating step that calculates a second midpoint of the substrate using three edge positions out of the four edge positions of the substrate detected in the second position detecting step; a first determining step that determines a real midpoint of the substrate based on moving status of first and second midpoints of the substrate.

The objects of the inventive concept are not limited to the above mentioned effects. Other objects thereof will be understandable by those skilled in the art from the following descriptions.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

An apparatus of treating a substrate in accordance with an embodiment of the present invention can be used to perform photolithography process on a substrate like semiconductor wafer or flat display panel. Especially an apparatus of treating a substrate in accordance with an embodiment of the present invention can be used to perform coating process and developing process on a substrate. Below explains an example when wafer is used as a substrate.

Figure 1:
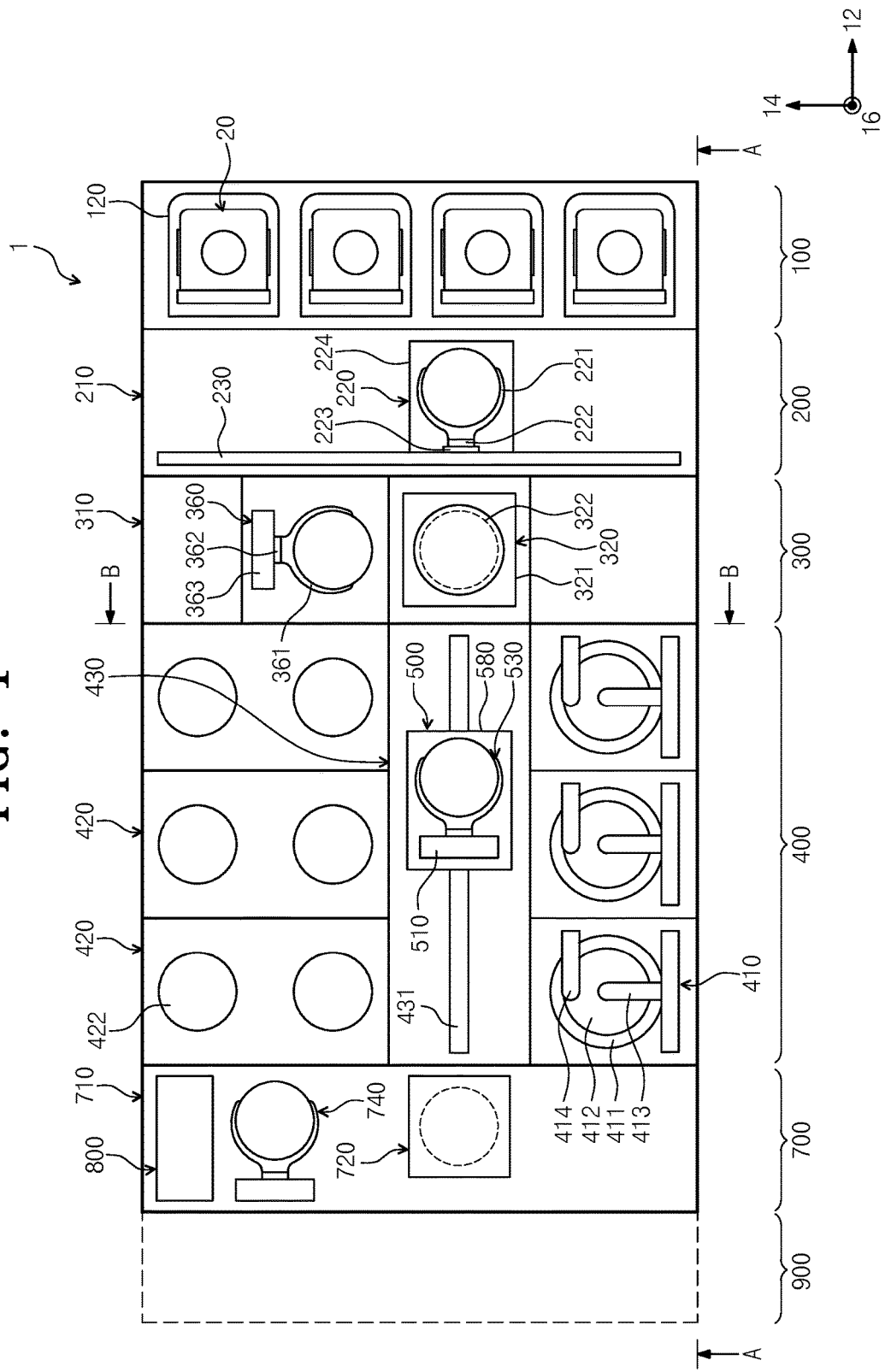
FIG. 1 is a plan view of an apparatus for treating a substrate in accordance with an embodiment.
Figure 2:
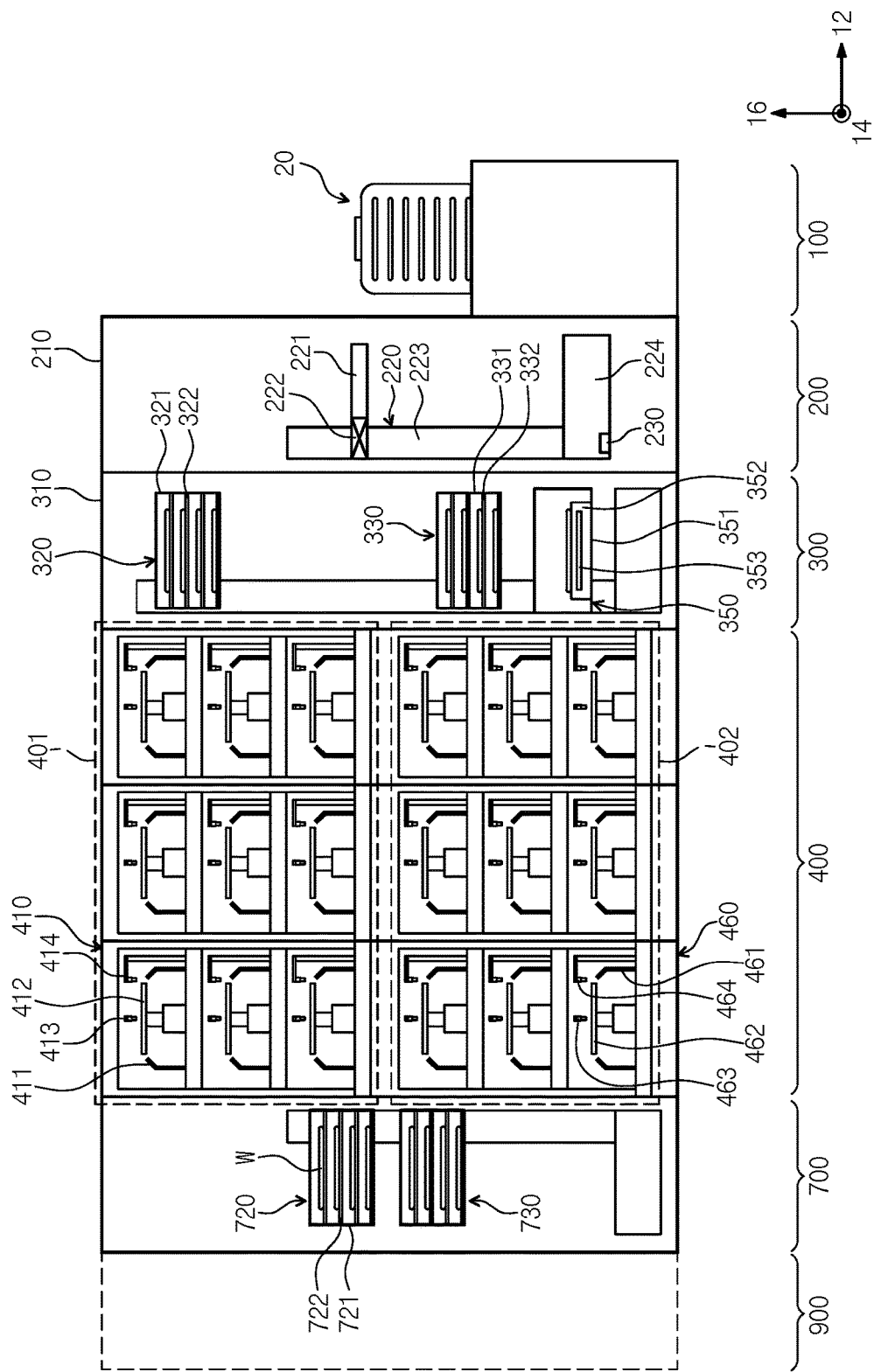
FIG. 2 illustrates the apparatus for treating a substrate of FIG. 1 viewed from A-A direction.
Figure 3:
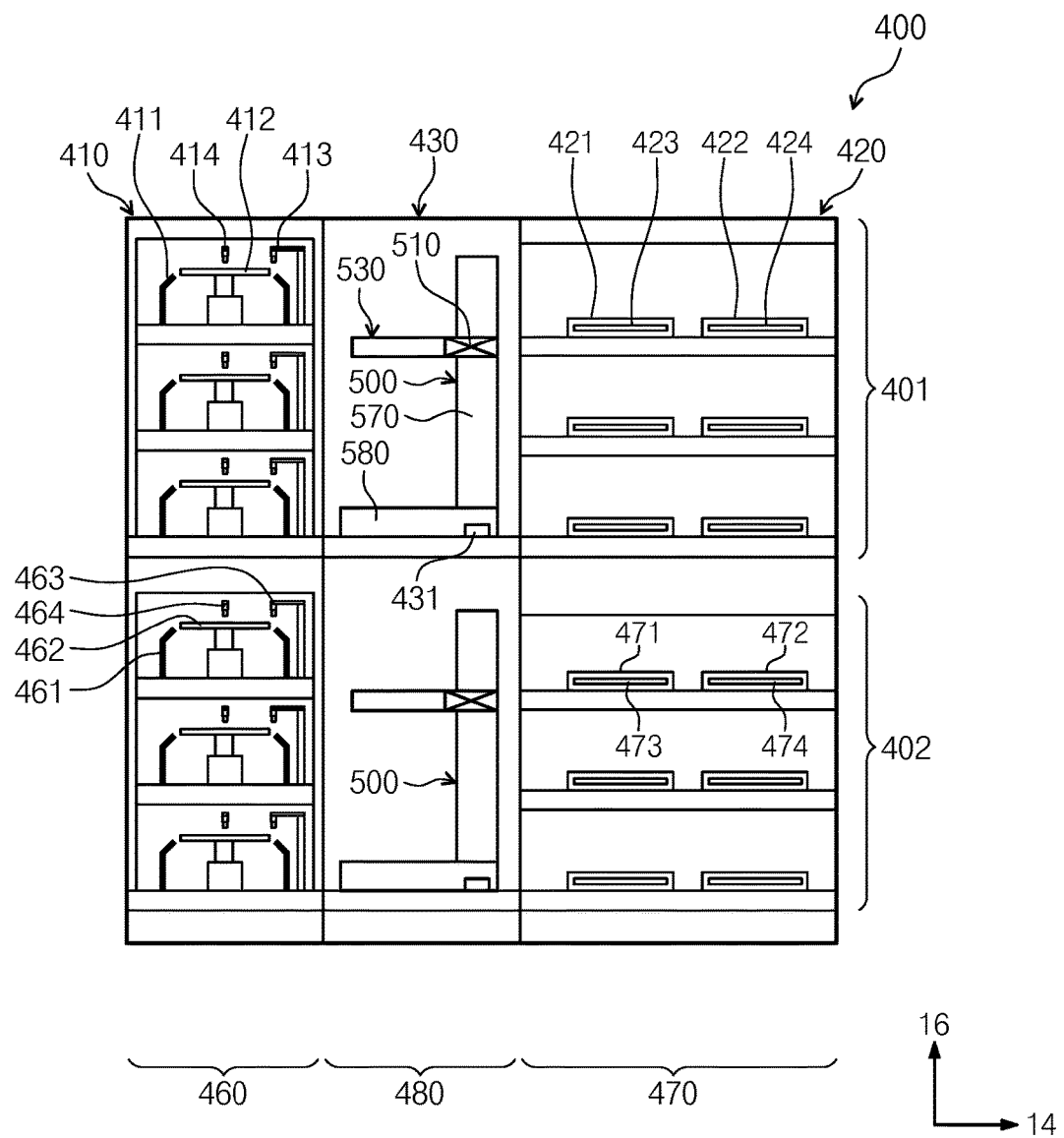
FIG. 3 illustrates the apparatus for treating a substrate of FIG. 1 viewed from B-B direction

FIGS. 1-3 show schematically a substrate treating apparatus 1 in accordance with an embodiment of the present invention. FIG. 1 is a plan view of the substrate treating apparatus 1, FIG. 2 shows the substrate treating apparatus viewed from A-A direction in FIG. 1, and FIG. 3 shows the substrate treating apparatus viewed from B-B direction in FIG. 1.

Referring to FIGS. 1-3, the substrate treating apparatus 1 includes a road port 100, an index module 200, a buffer module 300, a coating and developing module 400, and a purge module 800. The road port 100, the index module 200, the buffer module 300, the coating and developing module 400, and an interface module 700 are arranged in serial along one direction. The purge module 800 can be provided within the interface module 700. Differently, the purge module 800 can be provided at a various position, for example, at a rear end of the interface module 700 to which an exposure device is connected, a side part of the interface module 700.

Hereinafter, a direction where the road port 100, the index module 200, the buffer module 300, the coating and developing module 400, and the interface module 700 are arranged will be referred to as a first direction 12, a direction that is perpendicular to the first direction when viewed from the top will be referred to as a second direction 14, and a direction that is normal to a plane containing the first direction 12 and the second direction 14 will be referred to as a third direction 16.

A wafer W moves as received within a cassette 20. A cassette 20 has a sealed structure from outside. In an example, as the cassette 20, a Front Open Unified Pod (FOUP) having door in front thereof may be used.

The road port 100, the index module 200, the buffer module 300, the coating and developing module 400, the interface module 700, and the purge module 800 will be described in detail below.

The road port 100 has a placement table 120 where it places a cassette 20 in which wafers W are received. A plurality of placement tables 120 is provided and the plurality of placement tables 120 are arranged in a row along with the second direction 14. FIG. 2 exemplary illustrates four placement tables 120.

The index module 200 transfers wafer W between buffer module 300 and cassette 20 placed in the placement table 120 of the road port 100. The index module 200 includes a frame 210, an index robot 220, and a guide rail 230. The frame 210 is provided as rectangular shape where internal is generally empty, and placed in between the buffer module 300 and the road port 100. The frame 210 of the index module 200 may be provided having lower height than the frame 310 of the buffer module 300 which will be described later. The index robot 220 and the guide rail 230 is arranged within the frame 210. The index robot 220 is provided with a hand 221 that directly handles the wafer W to move and rotate to the first direction 12, the second direction 14, and the third direction 16. The index robot 220 includes a hand 221, an arm 222, a supporter 223, and a pedestal 224. The hand 221 is fixedly installed on the arm 222. The arm 222 is provided as expandable and contractible structure and rotable structure. The supporter 223 is arranged as its direction following the third direction. The arm 222 is movably connected to the supporter 223 along the supporter 223. The supporter 223 is fixedly connected to pedestal 224. The guide rail 230 is arranged as its direction following the second direction 14. The pedestal 224 is movably connected to the guide rail 230, moving linearly along the guide rail 230. Also, although it is not shown, the frame 210 is further provided with a door opener that opens and closes the cassette 20 door.

The buffer module 300 includes a frame 310, a first buffer 320, a second buffer 330, a cooling chamber 350, and a first robot 360. The frame 310 is provided as rectangular shape with empty internal, and is arranged between the index module 200 and the coating and developing module 400. The first buffer 320, the second buffer 330, the cooling chamber 350, and the first robot 360 are placed within the frame 310. The cooling chamber 350, the second buffer 330, and the first buffer 320 are sequentially arranged along the third direction 16 from the bottom. The first buffer 320 is located at a height corresponding to a height of the coating module 401 of the coating and developing module 400 which will be described later, and the second buffer 330 and the cooling chamber 350 are provided at a height corresponding to a height of the developing module 402 of the coating and developing module 400 which will be described later. The first buffer robot 360 is separately positioned with the second buffer 330, the cooling chamber 350, and the first buffer 320 along the second direction 14 with a certain distance.

The first buffer 320 and the second buffer 330 keep temporarily wafers W. The second buffer 330 has a housing 331 and a plurality of supporters 332. The supporters 332 are placed within the housing 331, and are spaced apart from each other along with the third direction 16. One of the wafers W is placed on each supporter 332. The housing 331 has an opening (not shown) on the direction where the index robot 220 is provided and on the direction where the first robot 360 is provided such that the index robot 220 and the first buffer robot 360 bring or take the wafers W in or out of the supporter 332 within the housing 331. The first buffer 320 generally has a similar structure to the second buffer 330. The difference is that in the first buffer 120, the housing 321 has an opening on the direction where the first buffer robot 360 is provided and on the direction where a coating unit robot 432 located on a coating module 401 is provided. The number of supporter 322 provided on the first buffer 320 and the number of supporter 332 on the second buffer 330 may be the same or different. According to an example embodiment, the number of supporter 332 provided on the second buffer 330 may be larger than the number of supporter 332 provided on the first buffer 320.

The first buffer robot 360 transfers wafer W in between the first buffer 320 and the second buffer 330. The first buffer robot 360 includes a hand 361, an arm 362, and a supporter 363. The hand 361 is fixedly installed on the arm 362. The arm 362 is provided as expandable and contractible structure, and moves along the second direction 14. The arm 362 is movably connected to supporter 363 and moves linearly along the supporter 363 in the third direction 16. The supporter 363 has an extended length from a point corresponding to the second buffer 330 and to a point corresponding to the first buffer 320. The supporter 363 may be provided longer along the top or bottom direction. The first buffer robot 360 may be provided for the hand 361 to be only two axle drive along the second direction 14 and the third direction 16.

The cooling chamber 350 cools each wafer W. The cooling chamber 350 includes a housing 350 and a cooling plate 352. The cooling plate 352 has an upper side where wafer W places and a cooling means 353 that cools wafer W. The cooling means 353 utilizes cooling by cooling water or cooling by thermoelectric element, or various methods may be used. Also, the cooling chamber 350 may be provided with a lift pin assembly that places wafer W on a cooling plate 352. The housing 351 has an opening on a direction where the index robot 220 is provided and on a direction where the developing unit robot is provided such that the developing unit robot provided on the index robot 220 and the developing module 402 bring or take wafer W in or out of the cooling plate 352. Also, the cooling chamber 350 is provided with doors that open and close the above-described opening.

The treating module 400 performs a coating process that coats photoresist on a substrate W before exposure process and a developing process that develops a substrate W after exposure process. Generally the treating module 400 has a rectangular cuboid shape. The treating module 400 has a coating module 401 and a developing module 402. The coating module 401 and the developing module 402 are arranged to divide each other as layer. According to an example embodiment, the coating module 401 is placed on top of the developing module 402.

The coating module 401 includes a coating process that coats photosensitive agent such as photoresist on a substrate W and a heat treatment process such as heating and cooling the substrate W before and after photoresist coating process. The coating module 401 includes processing chambers 410, 420 and a transporting chamber 430.

The processing chambers 410, 420 perform substrate processing process. In an example embodiment, the processing chambers 410, 420 include a resist coating chamber 410 and a bake chamber 420.

The resist coating chamber 410, the bake chamber 420, and the transporting chamber 430 are sequentially arranged along the second direction 14. Therefore, the coating chamber 410 and the bake chamber 420 are positioned separately each other along the second direction 14 with interposing the transporting chamber 430 there between. A plurality of the resist coating chambers 410 are provided along the first direction 12 and the third direction 16, respectively. In Figs., as an example, six resist coating chambers 410 are illustrated. A plurality of bake chambers 420 are provided along the first direction 12 and the third direction 16, respectively. In Figs., as an example, six bake chambers 420 are illustrated. However, the number of the bake chamber 420 may greater than 6.

The transporting chamber 430 is placed in parallel with the first buffer 320 of the first buffer module 300 in the first direction 12. Within the transporting chamber 430, a transporting unit 500 and a guide rail 411 are positioned. Generally the transporting chamber 430 has a rectangular shape. The transporting unit 500 transfers a substrate W between bake chambers 420, resist coating chambers 400, the first buffer 320 of the first buffer module 300, and the first cooling chamber 520 of the second buffer module 500 which will be described later. The guide rail 411 is arranged such that the lengthwise the direction is parallel with the first direction 12. The guide rail 411 guides the transporting unit 500 to move linearly in the first direction 12.

A detailed component of the transporting unit 500 will be described later.

All resist coating chambers 410 have the same structures. Only sorts of photo resist used in each of resist coating chamber 410 may be different from each other. In an example, a chemical amplification resist may be used as a photoresist. The resist coating chamber 410 coats photoresist on a substrate W. The resist coating chamber 410 has a housing 411, a supporting plate 412, and a nozzle 413. The housing 411 has a cup shape where upper side is open. The supporting plate 412 is placed within the housing 411, and supports the substrate W. The supporting plate 412 is provided to be rotable. The nozzle 413 provides photoresist onto the substrate W placed on the supporting plate 412. The nozzle 413 has a circular tube shape, and may provide photoresist to a center of the substrate W. Selectively, the nozzle 413 has a length corresponding to a diameter of the substrate, and discharge port of the nozzle 413 may be provided as a slit. Also, additionally in order to clean surface of the substrate to which photo-resist is coated, a nozzle 414 that provides cleaning solution such as deionized water may be provided in the resist coating chamber 410.

The bake chamber 420 conducts heat treatment to the substrate W. For example, the bake chambers perform a prebake process which heats the substrate W, before coating photoresist, at a predetermined temperature to remove moisture or organic substances from the substrate W, a soft bake process after coating photoresist on the substrate W, and a cooling process that cools the substrate W after each heating processes. The bake chamber 420 has a cooling plate 420 or a heating plate 422. The cooling plate 421 is provided with, a cooling water or a cooling system 423 such as thermoelectric element. Also, the heating plate 422 is provided with a hot wire or a heating system 424 such as thermoelectric element. Each cooling plate 421 and heating plating 422 may be provided within one bake chamber 420, respectively. Selectively, a part of the bake chambers 420 may be provided with only cooling plate 421, and a part of the bake chambers 420 may be provided with only equip heating plate 422.

The developing module 422 performs: a developing process that removes a part of photoresist by providing developing solution to obtain a pattern on the substrate W, and a heat treatment process such as heating and cooling the substrate W before and after the developing process. The developing module 402 has a developing chamber 460, a bake chamber 470, and a transporting chamber 480. The developing chamber 460, the bake chamber 470, and the transporting chamber 480 are sequentially arranged along the second direction 14. Therefore, the developing chamber 460 and the bake chamber 470 are positioned separately from each other in the second direction 14 with interposing the transporting chamber 480 there between. A plurality of developing chambers 460 are provided along the first direction 12 and the third direction 16, respectively. In FIGS. 1-3, as an example, 6 developing chambers are illustrated. A plurality of bake chambers 470 are provided along the first direction 14 and the third direction 16, respectively. In FIGS. 1-3, as an example, 6 bake chambers 470 are illustrated. However, more than 6 bake chambers 470 may be provided.

The transporting chamber 480 is positioned in parallel with the second buffer 330 of the first buffer module 300 in the first direction 12. Within a transporting chamber 480, a developing unit robot 482 and a guide rail 483 are positioned. Generally the transporting chamber 480 has a rectangular shape. The developing unit robot 482 transfers substrate W between the bake chambers 470, the developing chambers 460, the cooling chamber 350 and the second buffer 330 of the first buffer module 300, and the second cooling chamber 540 of the second buffer module 500. The guide rail 483 is arranged such that its lengthwise direction is parallel with the first direction 12. The guide rail 483 guides the developing unit robot 482 as to move linearly in the first direction 12. The developing unit 482 has a hand 484, arm 485, a supporter 486, and a pedestal 487. The hand 484 is fixedly installed on the arm 485. The arm 485 is provided as an expandable and contractible structure and makes possible for the hand 484 to move in a horizontal direction. The supporter 486 is provided such that its lengthwise direction is parallel with the third direction 16. The arm 485 is movably connected to the supporter 486 such that the arm 485 moves linearly along the supporter 486 in the third direction 16. The pedestal 487 is movably connected to guide rail 283 to move along the guide rail 483.

All developing chambers 460 have the same structure. Only kinds of developing solutions used in each developing chamber 460 may be different from each other. The developing chamber 460 performs a developing process that removes photoresist from the area of the substrate W to which a light is irradiated. At this time, a protection layer formed in an area where to which a light is irradiated is also removed. Depending on a type of photoresist, photoresist and protection layer formed in an area to which a light is not irradiated may be removed.

The developing chamber 460 has a housing 461, a supporting plate 462, and a nozzle 463. The housing has a cup shape where upper side is open. The supporting plate 462 is placed within the housing 461, and supports substrate W. The supporting plate 462 is provided rotatably. The nozzle 463 provides developing solution on the substrate W supported on the supporting plate 462. The nozzle 463 has a circular tube shape, and may provide developing solution to a center of the substrate W. The nozzle 463 may have a length corresponding to a diameter of the substrate W, and discharge port of the nozzle 463 may be provided as a slit. Also, the developing chamber 460 may be further provided with a nozzle 464 that provides cleaning solution such as deionized water to clean the surface of substrate W to which developing solution has been provided.

The bake chamber 470 performs heat treatments to the substrate W. For example, the bake chambers 470 perform post-bake process which heats the substrate W before developing process hard-bake process which heats the substrate W after performing post bake process, and a cooling process which cools heated substrate W after each bake process. The bake chamber 470 has a cooling plate 471 or a heating plate 472. In cooling plate 471, cooling water or cooling system 473 such as thermoelectric element is provided. Or in a heating plate 472, a hot wire or a heating system 474 such as thermoelectric element is provided. The cooling plate 471 and the heating plate 472 may be provided within one bake chamber 470, respectively. Optionally, a part of the bake chambers 470 is provided with only cooling plate 471, and a part of the bake chambers 470 may be provided with only heating plate 472.

In treating module 400, coating module 401 and the developing module 402 is provided as to be divided each other as described above. Also, from a top view the coating module 401 and developing module 402 may have the same chamber arrangement.

In above-described example, although the coating and developing module 400 provided as six layers was explained as an example, based on processing process the coating and developing module 400 may be provided with seven layers or more.

The interface module 700 transfers the substrate W. The interface module 700 includes a frame 710, a first buffer 720, a second buffer 730, and an interface robot 740. The first buffer 720, the second buffer 730, and the interface robot 740 are placed within the frame 710. The first buffer 720 and the second buffer 730 are spaced apart from each other by a certain distance, and are arranged to stack each other. The first buffer 720 is arranged higher than the second buffer 730.

The interface robot 740 is placed separately with the first buffer 720 and the second buffer 730 in the second direction 14. The interface robot 740 carries the substrate W between the first buffer 720, the second buffer 730, and the exposure device 900.

The first buffer 720 temporarily keeps substrates W, to which some processes have been performed, before moving to the exposure device 900. And then the second buffer 730 temporarily keeps the substrates W, to which some processes have been already performed in the exposure device 900, before they get moved. The first buffer 720 has a housing 721 and a plurality of supporters 722. Supporters 722 are arranged within the housing 721, and spaced apart from each other along the third direction 16. In each supporter 722, a single substrate W is placed. The housing 721 has an opening on the direction where the interface robot 740 is provided and on the direction where the pretreating robot 632 is provided, for the interface robot 740 and the first pretreating robot 632 to bring or take the substrate W in or out of the supporter 722 within the housing 721. The second buffer 730 has similar structure to the first buffer 720. In the interface module, as described above only buffers and robot may be provided without chamber which performs a certain process for the wafer.

The purge module 800 may be arranged within the interface module 700. Specifically, the purge module 800 may be arranged in a position facing the first buffer 720 with centrally placing the interface robot 740. However, the purge module 800 may be provided in a rear side of the interface module 700 to which the exposure device 900 is connected or at the side of the interface module 700 or in various positions. The purge module 800 performs gas purge process and rinse process.

Figure 4:
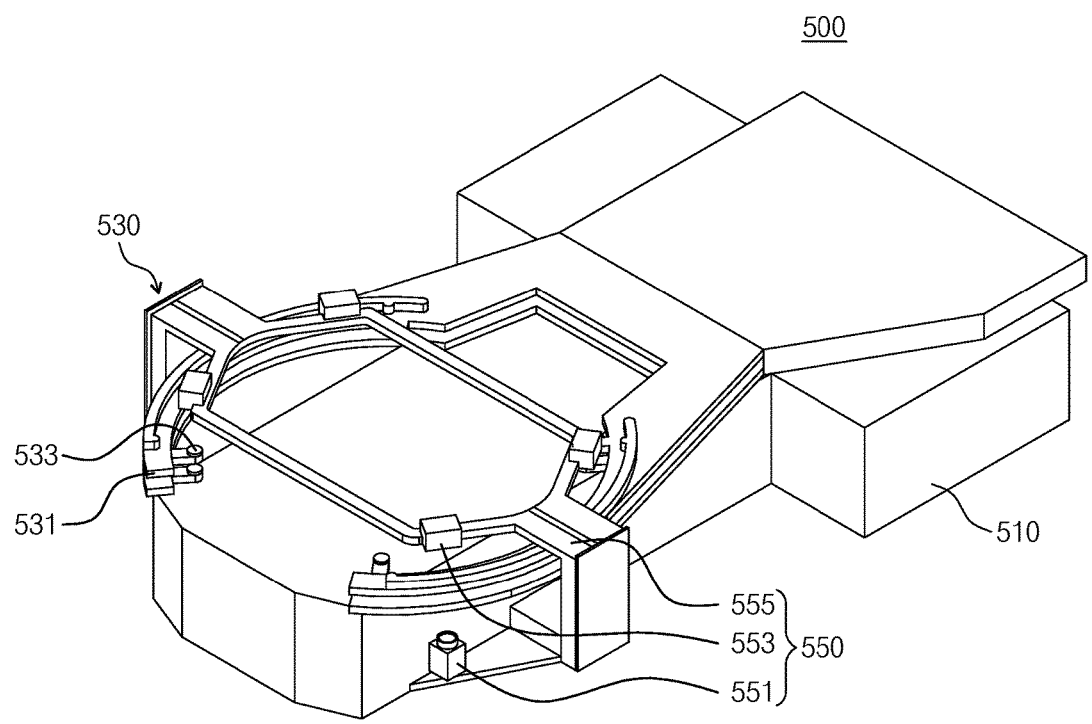
FIG. 4 is a perspective view that shows a transporting unit.
Figure 5:
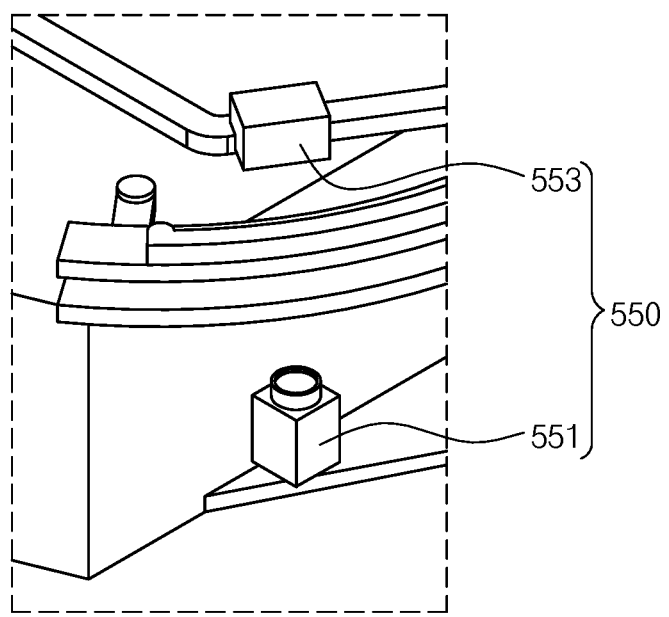
FIG. 5 is a perspective view that shows a position detecting member.
Figure 6:
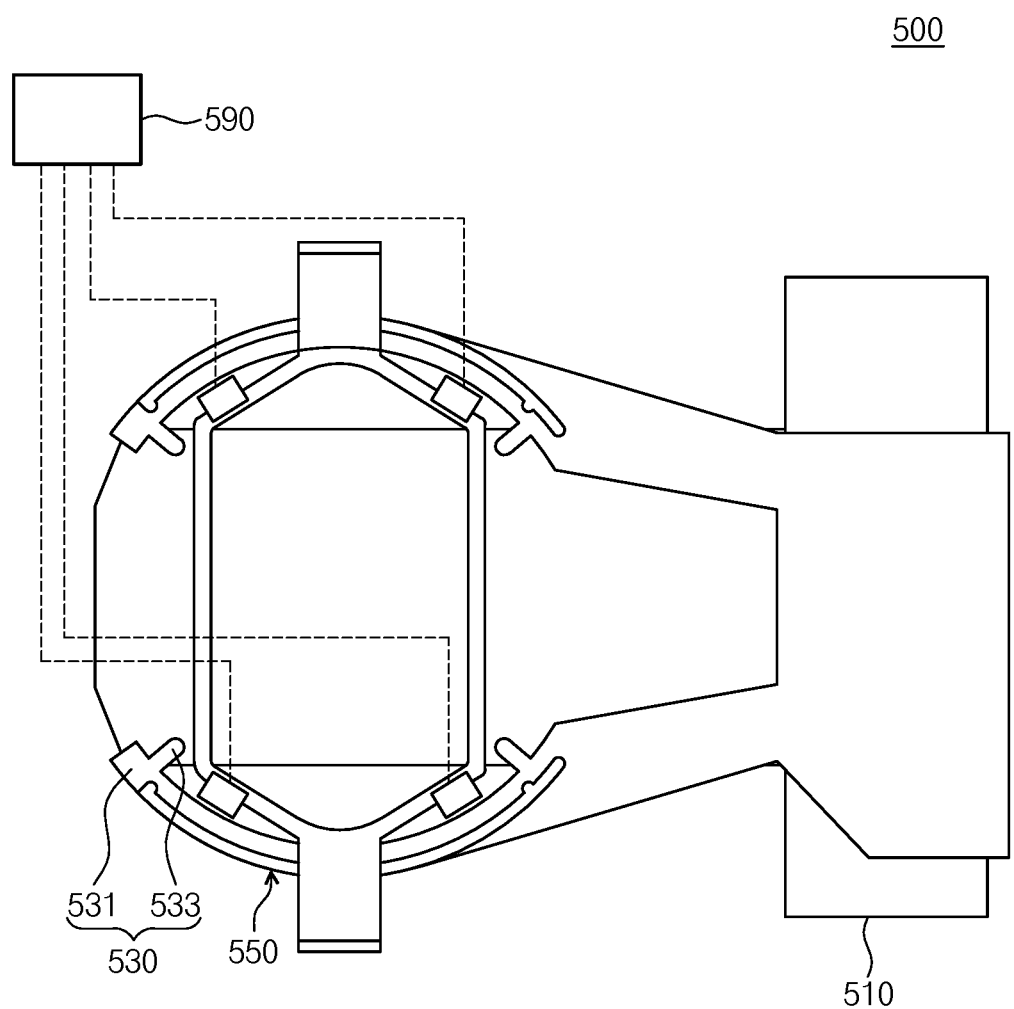
FIG. 6 is a plan view of a transporting unit of FIG. 4.

FIG. 4 is a perspective view showing a transporting unit of the FIG. 1, FIG. 5 is a perspective view of a position detecting member of FIG. 4, and FIG. 6 is a plan view of the transporting unit of FIG. 4.

Referring to FIGS. 4-6 hereinafter, a transporting unit 500 includes a base 510, a transfer arm 530, a position detecting member 550, a supporter 570, a pedestal 580, and a controller 590.

In the base 510, the transfer arm 530 is installed. The transfer arm 530 supports substrate W and transfers substrate W. A plurality of transfer arms 530 may be provided. In an example, two transfer arms 530 may be provided. However, the transfer arm 530 may be provided with different numbers. The transfer arm 530 has a hand 531 and a retaining part 533.

The hand 531 is fixedly installed on the transfer arm 530. The transfer arm 530 is provided with expandable and contractible structure so the hand 531 may move to a horizontal direction. From the top view, the hand 531 generally has a circular shape. The supporter 570 is provided such that its lengthwise direction is parallel with the third direction 16. The transfer arm 530 is connected to the supporter 570 such that the transfer arm 530 moves linearly along the supporter 570 in the third direction 16. The supporter 570 is fixedly connected to the pedestal 580 and the pedestal 580 is connected to the guide rail 411 such that the pedestal 580 moves along the guide rail 411.

The retaining part 533 is installed on hand 531. The retaining part 533 supports a bottom of the substrate W. In an example, the retaining part 533 may support the substrate W by vacuum adsorption. A plurality of retaining parts 533 may be provided. In an example, four retaining parts 533 are provided. Four retaining parts 533 combine each other and arranged forming a circle. In the above-described example, although four retaining parts 533 are provided as example, three or five or more retaining parts may be provided.

The position detecting member 550 detects edge positions of a substrate W supported by the transfer arm 530. The position detecting member 550 is installed on the base 510. A plurality of position detecting members 550 may be provided. In an example, four position detecting members 550 may be provided. In this case, the position detecting members 550 may detect four edge positions of the substrate W. In an example, the position detecting member 550 may be provided as laser displacement sensor.

The position detecting member 550 includes a light emitting part 551, a light receiving part 553, and a supporting part 555.

The light emitting part 551 irradiates a light. The light emitting part 551 is fixedly installed on the bottom of the base 510. A plurality of light emitting parts 551 may be provided. In an example, four light emitting parts 551 are provided. Four light emitting parts 551 are installed on the base 510, and arranged as circular shape. A light source irradiated by the light emitting area 551 may a laser light. The light emitting part 551 may be provided as a LED light.

The supporting part 555 is connected to the base 510 and is positioned over the transfer arm 530. The light receiving part 553 is fixedly installed on the supporting area 555.

The light receiving part 553 receives an irradiated light from the light emitting part 551. The light receiving part 553 may detect a position of the substrate W depending on the amount of light received. For example, the amount of light irradiated from the light emitting part 551 when there is no substrate W is a reference value. After that, when the substrate is retained by the transfer arm 530, and when a light is irradiated from the light emitting part 551, a position of the substrate W can be detected by the amount of received except light blocked by the substrate W. The light receiving part 553 receives a laser light when the position detecting member 550 is provided as the laser displacement. When the light emitting part 551 irradiates a LED light, the light receiving part 553 may be provided as a linear image sensor. In an example, the linear image sensor may be provided with many kinds of linear sensor such as CCD (Charge Coupled Device) linear sensor, fiber linear sensor, and photoelectric sensor.

The controller 590 receives four edge positions of the substrates W detected by the position detecting member 550. The controller 590 may detect a center of the substrate W by using 4 edge positions of the substrate W.

The controller 590 calculates the amount of dislocation of the substrate W retained by the transfer arm 530 by using the detected center of the substrate W and transports the substrate W based on the calculated amount of distortion of the substrate W.

The controller 590 controls transfer arm 530 and transports the substrate W to perform steps: a substrate center detecting step that calculates a center of a substrate, a dislocation calculating step that calculates the amount of dislocation of a substrate by comparing the reference center of the substrate and the center of the substrate obtained in the substrate center detecting step, and a substrate transporting step that transports the substrate by correcting transporting position of the substrate based on the amount of dislocation of the substrate obtained in the dislocation calculating step.

Hereinafter a method for detecting the center of the substrate in accordance with an embodiment of the present invention will be described.

Figure 7:
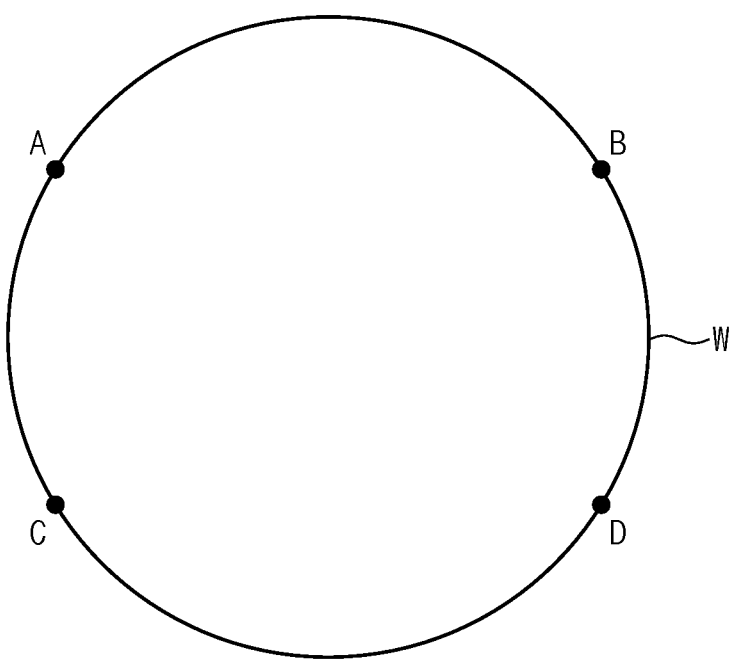
FIG. 7 and FIG. 8 illustrate an example of detected edge position of a substrate by a transporting unit of FIG. 4.
Figure 8:
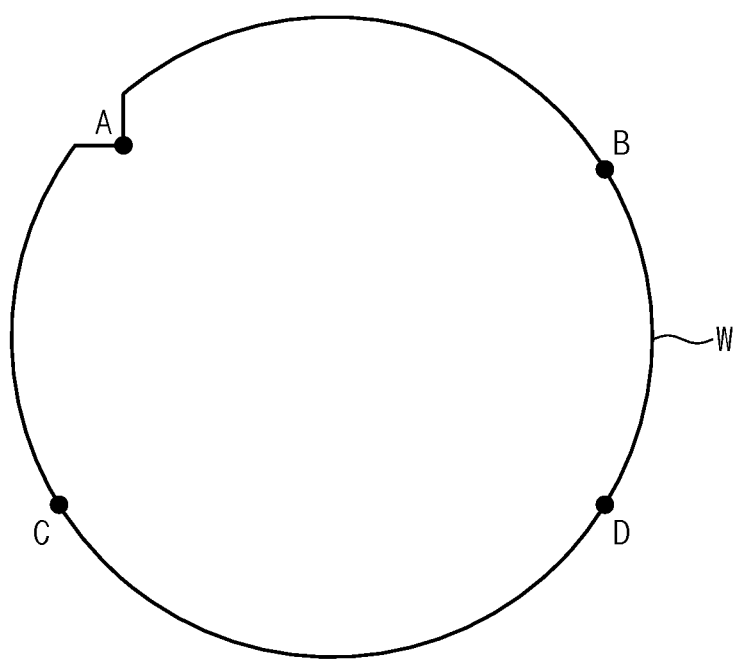

The position detecting member 550 detects edge points of the substrate W placed on the transfer arm 530. Four edge position detecting members 550 detect 4 edge positions of the substrate W. FIGS. 7 and 8 show an example of detecting edge position of the substrate by the transporting unit of FIG. 4. Referring to FIG. 7 all edge positions A, B, C, and D of the substrate W may be detected as normal position like FIG. 7. However, referring to FIG. 8, edge positions A, B, C and, D may include notch position A. When detecting edge positions of normal substrate W like FIG. 7, a center of the substrate W can be calculated by using 4 detected edge positions of the substrate W.

However, when detected edge positions include a notch position like FIG. 8, the calculated center of the substrate W may not match with the real center of the substrate W. Therefore, it is needed to calculate the center of the substrate W by using edge positions not including notch position.

A method to obtain the center of the substrate W using 4 edge positions of the substrate W is like below.

Hereinafter as an example, a method for calculating a center of the substrate using 4 edge positions of the substrate. 4 edge positions of the substrate includes points A, B, C, and D. Points A, B, C, and D may be indicated as A (x1, y1), B (x2, y2), C (x3, y3), and D (x4, y4), respectively.

Among points A, B, C, and D, 3 points are used to calculate a midpoint of a substrate. Here explains a method for calculating a midpoint of a substrate by using points A, B, and C.

First, an equation of straight line that connects points A and B can be obtained.

$$y=ax+b \qquad \text{(formula 1)}$$

wherein 'a' is a slope of the equation of straight line that connects point A and B. The slope 'a' may be calculated like below.

$$a=(y2-y1)/(x2-x1)$$

Likewise, an equation of straight line that connects points A and C may be calculated.

$$y=cx+d \qquad \text{(formula 2)}$$

wherein 'c' is a slope of equation of straight line that connects points A and C in here. The slope 'c' may be calculated like below.

$$c=(y3-y1)/(x3-x1)$$

Next, a normal equation that passes a midpoint of segment AB in formula 1.

$$y=-1/a+c \qquad \text{(formula 3)}$$

Next, a normal equation that passes a midpoint of segment AC in formula 2.

$$y=1/c+e \qquad \text{(formula 4)}$$

Next, a midpoint of a substrate is given as an intersection point of a normal equation of formula 3 and a normal equation of formula 4.

Figure 9:
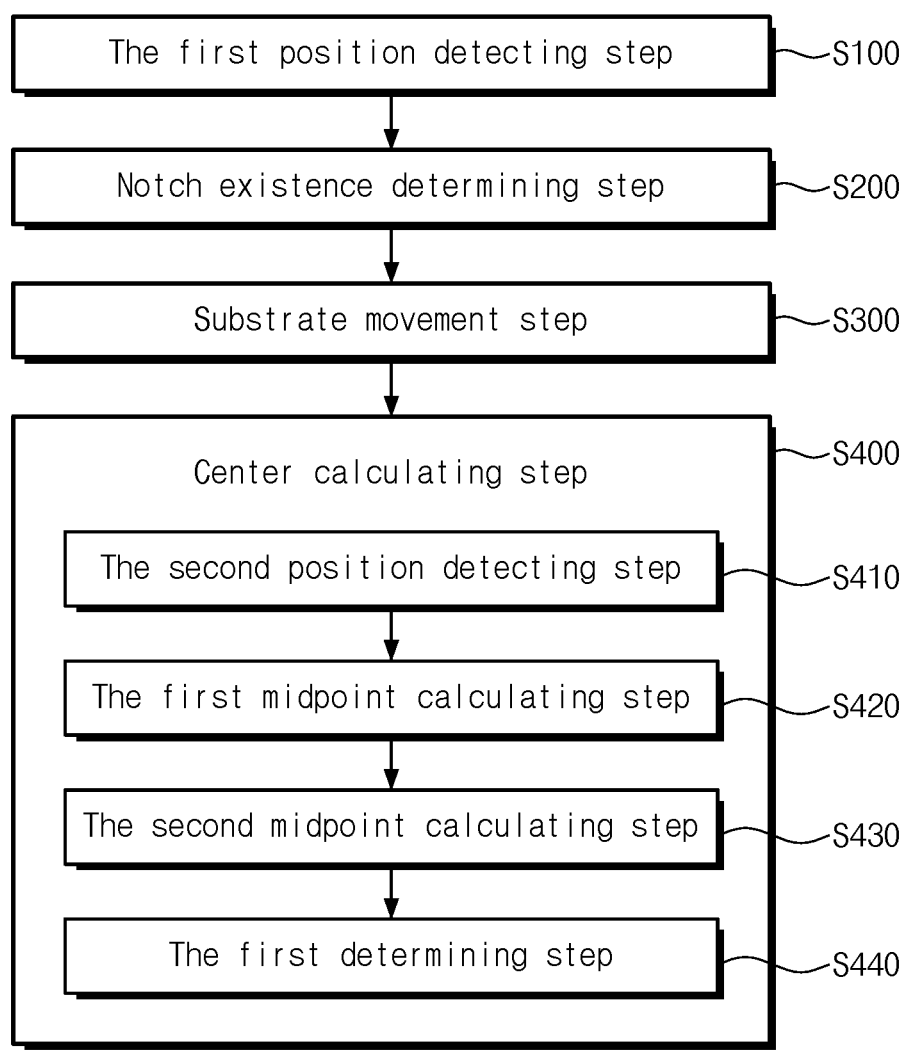
FIG. 9 is a flow chart that shows a substrate center detecting method in accordance with an embodiment.

FIG. 9 is a flow chart of a method for detecting the center of substrate in accordance with an embodiment of the present invention.

Referring to FIG. 9, a substrate center detection method S10 includes the first position detecting step S100, a notch existence judging step S200, a substrate movement step S300, and a center calculating step S400.

The first position detecting step S100 detects four edge positions of substrate W. 4 edge positions of the substrate W placed on the transfer arm 530 are detected by using a position detecting member 550.

Figure 12:
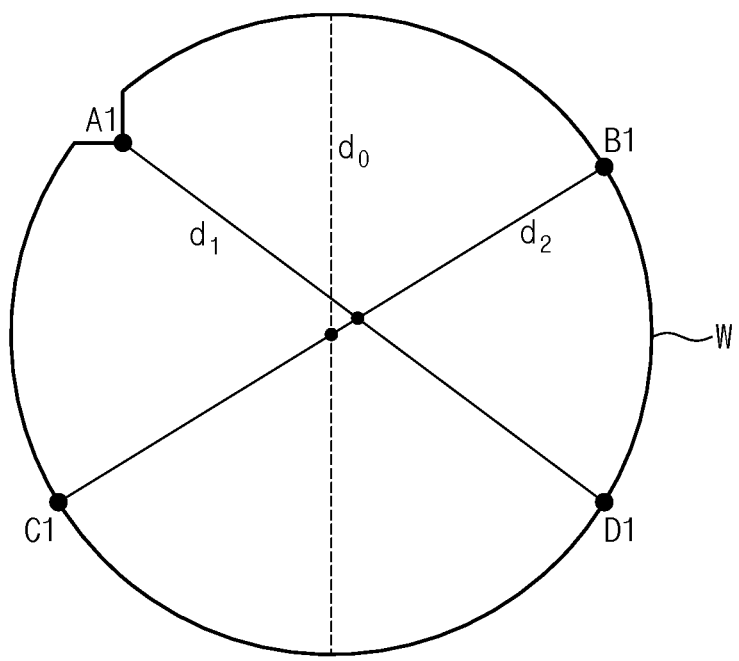
FIG. 12 shows a method for checking existence of a notch using detected four edge positions.

The notch existence judging step S200 judges whether a notch exists in the detected four edge positions of the substrate W or not. In the notch existence judging step S200, it calculates distances $d_1$ and $d_2$ between two edge positions A1 and D1, and between two edge points B1 and C1, respectively that are positioned on diagonal direction of each other as shown in FIG. 12. Each diagonal distance $d_1$, $d_2$ is compared with a diameter $d_0$ of the substrate W and a differential is calculated between each diagonal distance and the diameter $d_0$ of the substrate W. When the differential is greater than a predetermined value, it is determined that there exists a notch among the four edge positions. In FIG. 12, the differential between the diameter $d_0$ of the substrate and the diagonal distance $d_1$ between two edge points A1 and D1 is greater than the predetermined value, and thus one of the two edge points A1 and D1 is a notch is judged as a notch.

However, when all differentials between the diameter $d_0$ and two diagonal distances $d_1$ and $d_2$ are within the predetermined value, it is judged that there is no notch among four detected edge positions.

In an exemplary embodiment, in notch existence judging step S200, it may judge existence of notch by obtaining 4 midpoints of substrates by using three edge positions selected from four detected edge positions.

In the notch existence judging step S200, it judges whether there exists a notch among the four detected edge positions of the substrate W or not. The notch existence judging step S200 obtains 4 midpoints of the substrate by using 4 combinations of three edge positions selected from four detected edge positions. The existence of notch can be judged based on the calculated distances between midpoints of the substrate.

Figure 16:
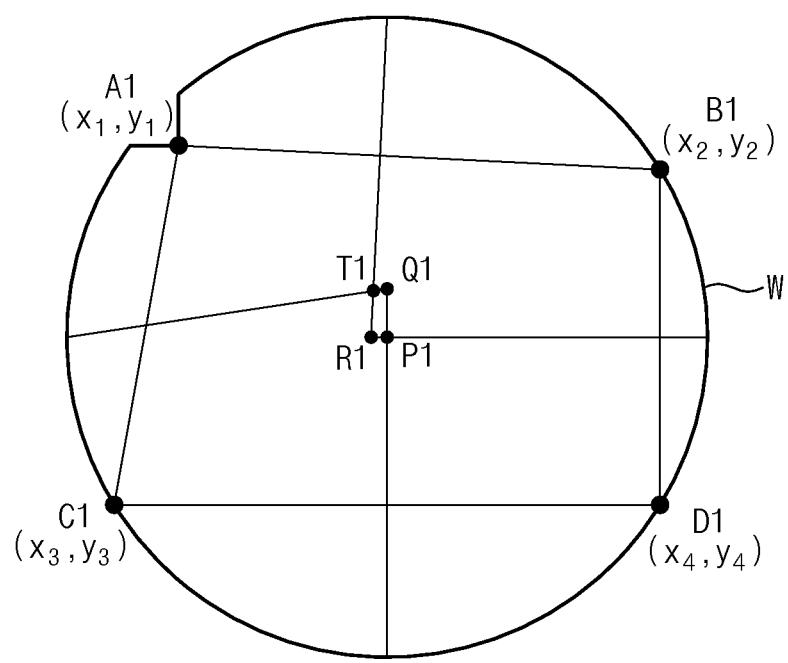
FIGS. 16-18 show another method for checking the existence of notch by using detected four edge positions.

In an example, FIG. 16 illustrate four midpoints P1, Q1, T1, R1 of the substrate by using 4 different sets including three edge positions selected from four detected edge positions A1, B1, C1, and D1.

Figure 17:
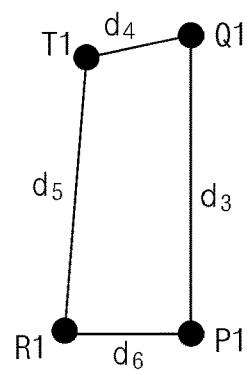

In the notch existence judging step S200, each of the distances $d_3$, $d_4$, $d_5$, $d_6$ between two adjacent midpoints among four midpoints P1, Q1, T1, R1 can be calculated. Each distance between two adjacent midpoints in here is defined as each side length of square that connects four midpoints as shown in FIG. 17. In the notch existence judging step S200, when sum of four calculated distances $d_3$, $d_4$, $d_5$, $d_6$ is bigger than the predetermined value, it is judged that there exists a notch among four edge positions A1, B1, C1, and D1.

In an exemplary embodiment, the notch existence judging step S200 may further calculate diagonal distances between two midpoints which are placed in diagonal direction of each other.

Figure 18:
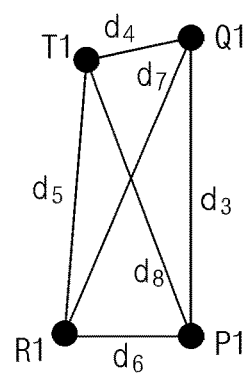

As shown in FIG. 18, two diagonal distances $d_7$ and $d_8$, respectively between two midpoints Q1 and R1 which are placed in diagonal direction of each other and between two midpoints T1 and P1 which are placed in diagonal direction of each other can be obtained.

The notch existence judging step S200 may judges that there exists a notch among four edge positions A1, B1, C1, and D1 when sum of calculated value of six distances $d_3$, $d_4$, $d_5$, $d_6$, $d_7$, and $d_8$ is bigger than the predetermined value.

Different from the examples described above, when sum of the distance of midpoints is within the predetermined value, it is judged that there is no notch among four edge positions.

In this case, a center calculating step S400 which will be described later is performed.

The substrate movement step S300 moves substrate W when it is judged that there is a notch among four detected edge positions in the notch existence judging step S200. In an example, the movement of substrate W moves substrate W by predetermined direction or distance.

The substrate movement step S300 may be omitted when it is judged that there is no notch among four detected edge positions in the notch existence judging step S200.

The center calculating step S400 is a step where it calculates a center of substrate W. The center calculating step S400 calculates a center of substrate W by using four detected edge positions. The center calculating step S400 calculates a center of substrate W by using four detected edge positions when it is judged that there is no notch among four detected edge positions in the notch existence judging step S200.

When it is judged that there is a notch among four detected edge positions in the notch existence judging step S200, the center calculating step S400 calculates a center of substrate W by performing.

a second position detecting step S410, a first midpoint calculating step S420, a second midpoint calculating step S430, and a first determining step S440.

The second position detecting step S410 is a step where it re-detects four edge positions of a substrate W that has been moved in the substrate movement step S300.

Figure 13:
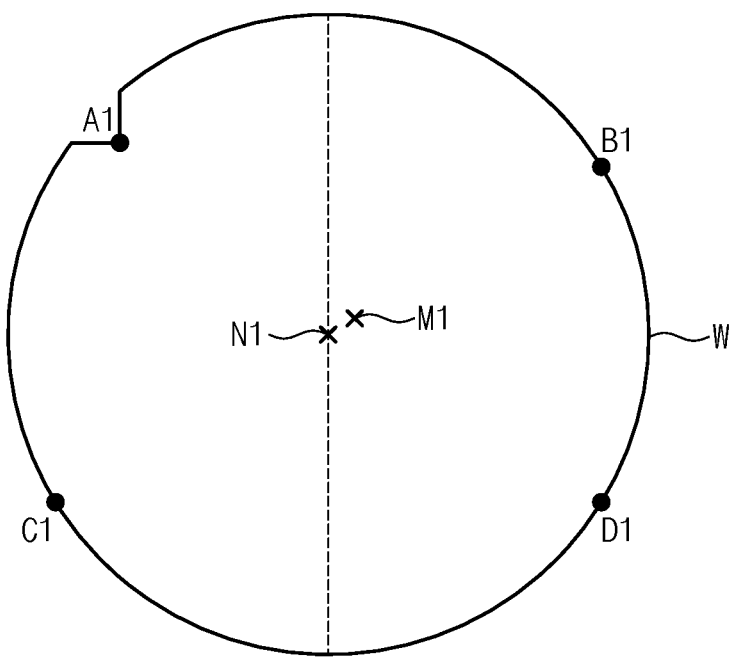
FIG. 13 shows obtaining a center of a substrate using detected four edge positions.
Figure 14:
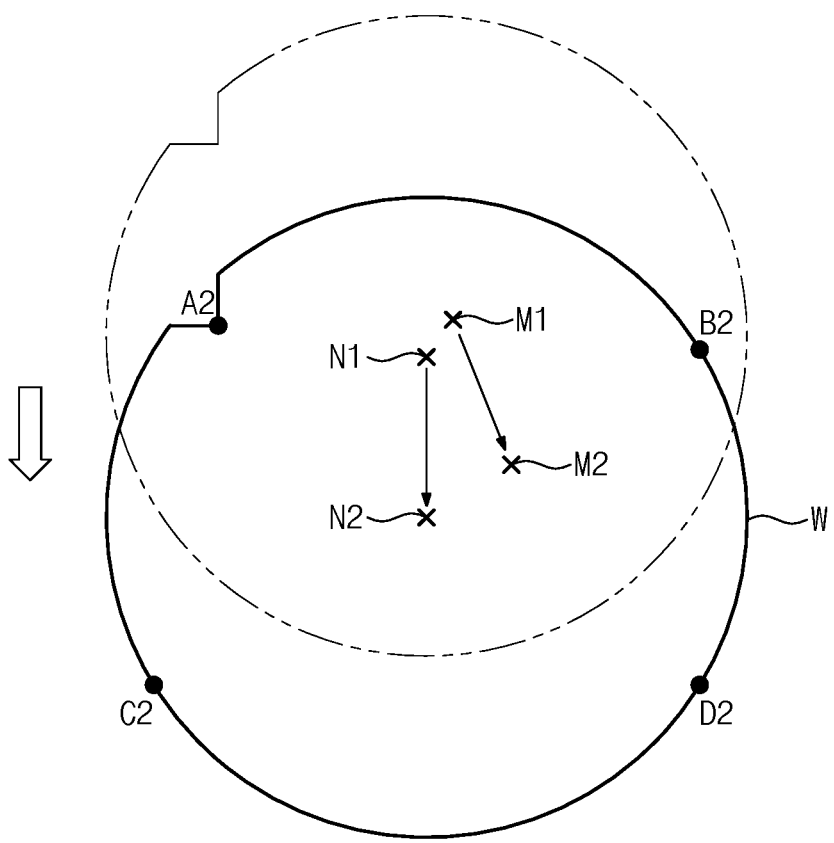
FIG. 14 and FIG. 15 show a method for detecting a center of a substrate by using detected four positions.

The first midpoint calculating step S420 is a step where it calculates a midpoint of substrate W by four edge positions A1, B1, C1, and D1 detected in the first position detecting step S100. FIG. 13 illustrates an example of the first midpoint calculating step calculating two midpoints M1 and N1 of a substrate W. When it is judged that there is a notch in the notch existence judging step S200, the first midpoint calculating step S420 calculates two midpoints M1 and N1 of substrate W by using two edge positions A1, D1 which was used to calculate a diagonal distance that has been out of the predetermined range and two edge positions B1, C1 which was used to calculate a diagonal distance that has been in the predetermined range in the notch existence judging step S200, respectively The second midpoint calculating step S430 is a step where it calculates a midpoint of a substrate W by four edge positions A2, B2, C2, and D2 detected in the second position detecting step S410. For example, as shown in FIG. 14, in the second midpoint calculating step S430, it calculates two midpoints M2, N2 of substrate W. The second midpoint calculating step S430 calculates two midpoints M2 and N2 by using two edge positions B2, C2 corresponding to two edge positions B1, C1 that has been used to calculate a diagonal distance which is out of the predetermined range and two edge positions A2, D2 corresponding to two edge positions A1, D1 that has been used to calculate a diagonal distance which is in the predetermined range in the first midpoint calculating step S420, respectively.

Two edge positions that have been used to calculate a diagonal distance which is in the predetermined range and corresponding two edge positions are detected by the same position detecting member 550 before and after movement of substrate W, respectively. As shown in FIGS. 13 and 14, for example, two edge positions B1, C1 and two edge positions B2, C2 are detected by the same position detecting member 550 before and after movement of substrate, respectively and are two edge positions that has been used to calculate a diagonal distance which is in the predetermined range and corresponding two edge positions, respectively. Likewise the two edge positions that have been used to calculate a diagonal distance which is out of the predetermined range and corresponding two edge positions are detected by the same position detecting member 550 before and after movement of substrate, respectively. As shown in FIGS. 13 and 14, for example, two edge positions A1, D1 and two edge positions A2, D2 are detected by the same position detecting member 550 before and after movement of substrate, respectively and are two edge positions that has been used to calculate a diagonal distance which is in the predetermined position range and corresponding two edge positions, respectively.

The first determining step S440 may determine a real midpoint of a substrate W based on each movement status of a midpoint of a substrate calculated in the first midpoint calculating step S420 and the second midpoint calculating step S430.

In an example, in the first determining step S440, considering the movement status between corresponding midpoints before and after movement and movement of the substrate, the midpoint which has moved with the same movement status as the substrate W is determined as the real midpoint of the substrate W.

In an example, the real midpoint of the substrate W can be determined based on the direction of the movement. For example, the midpoint which has moved with the same direction as the substrate W is determined as the real midpoint of the substrate W.

Alternatively, the real midpoint of the substrate W can be determined based on the distance of the movement. For example, the midpoint which has moved with the same distance as the substrate W is determined as the real midpoint of the substrate W.

For example, in case of FIGS. 13 and 14, the midpoint of N1 and N2 of a substrate W that have moved with the same movement status as the movement of substrate W are calculated as the real midpoint of the substrate W. Also, three edge positions B1, C1, D1 and B2, C2, D2 that have been used to calculate midpoints N1 and N2 of the substrate W are determined as a position that there is no notch on substrate W, but A1 and A2 are determined as a position where notch exists.

However, a center calculating step S400 may calculate a center of a wafer in a different method.

The substrate movement step S300 moves a substrate W when there is a notch on the detected four edge positions in the notch existence judging S200. In an example, in the movement of a substrate W, the substrate W may move by predetermined direction or distance.

The substrate movement step S300 may be omitted when it is judged that there is no notch among four detected edge positions in the notch existence judging step S200.

The center calculating step S400 may calculate a center of a substrate W by using four detected edge positions. The center calculating step S400 calculates the center of substrate W by using four detected edge positions when there is no notch on four detected edge positions in the notch existence judging step S200.

When there is a notch on four detected edge positions in the notch existence judging step S200, the center calculating step S400 calculates the center of substrate by performing a second position detecting step S410, a first midpoint calculating step S420, a second midpoint calculating step S430, and a first determining step S440.

The second position detecting step S410 may re-detect four edge positions of a substrate W that has been moved in the substrate movement step S300.

Figure 19:
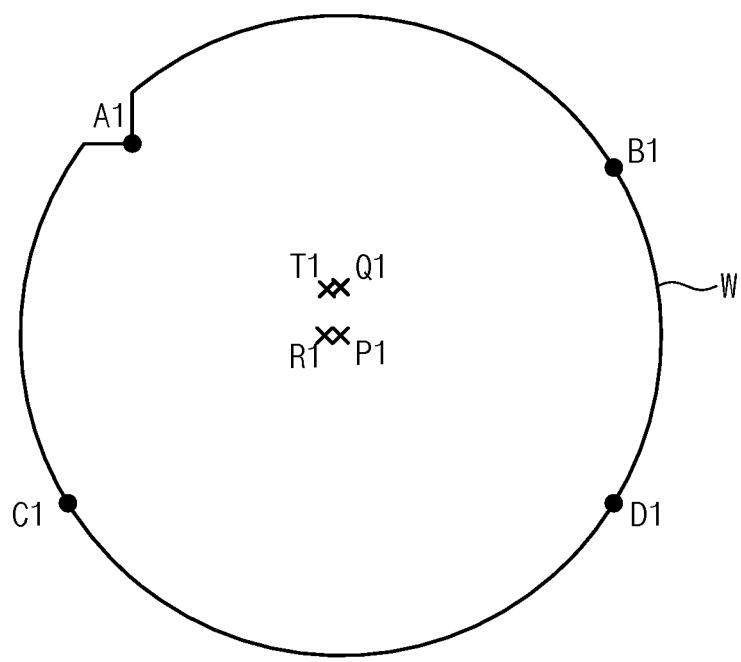
FIGS. 19-23 show a process determining a real midpoint of a substrate by using detected four edge positions of the substrate.

When it is determined that there is a notch from judging existence of notch step S200, the first midpoint calculating step S420 may calculate a midpoint of substrate W by using three edge positions among four edge positions A1, B1, C1, and D1 detected in the first position detecting step S100. The first midpoint calculating step S420 obtains four midpoints P1, Q1, T1, R1 by using different four sets including three edge positions among four detected edge positions A1, B1, C1, and D1, as shown in FIG. 19.

Figure 20:
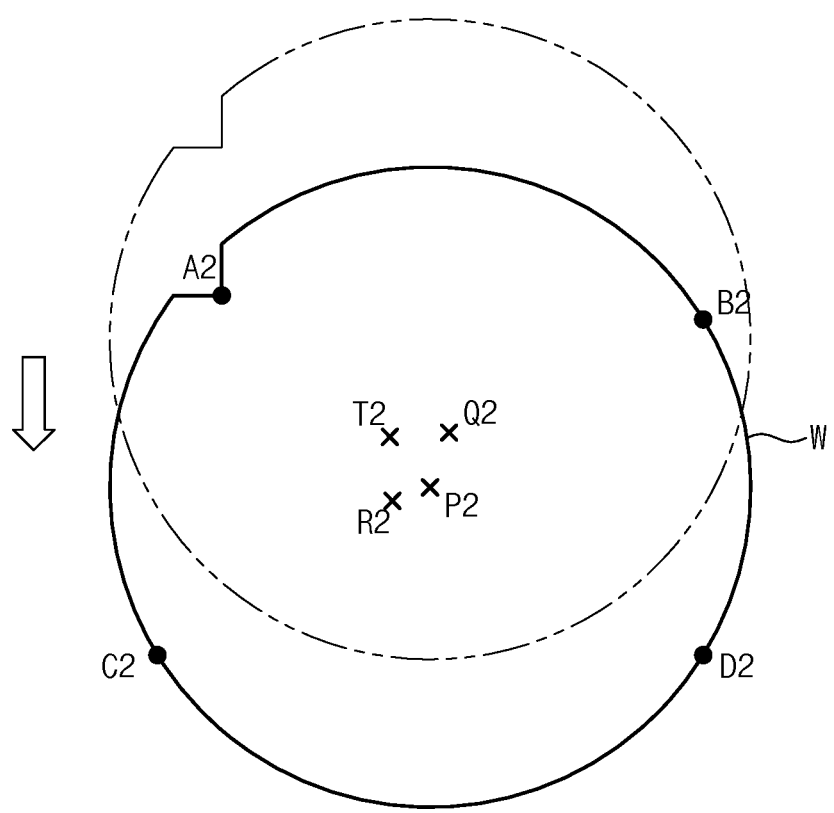

The second midpoint calculating step S430 may calculate a midpoint of substrate W by using three edge positions among four edge positions A2, B2, C2, and D2 detected in the second position detecting step S410. The second midpoint calculating step S430 may obtain four midpoints P2, Q2, T2, R2 by using different four sets including three edge positions among four detected edge positions A2, B2, C2, and D2 as shown in FIG. 20.

The first determining step S440 is a step where it determines a real midpoint of a substrate by movement status of calculated midpoints of substrate W between the first midpoint calculating step 420 and the second midpoint calculating step S430.

In an example, in the first determining step S440, considering the movement status between corresponding midpoints before and after movement and movement of the substrate, the midpoint which has moved with the same movement status as the substrate W is determined as the real midpoint of the substrate W.

In an example, the real midpoint of the substrate W can be determined based on the direction of the movement. For example, the midpoint which has moved with the same direction as the substrate W is determined as the real midpoint of the substrate W. Alternatively, the real midpoint of the substrate W can be determined based on the direction of the movement. For example, the midpoint which has moved with the same distance as the substrate W is determined as the real midpoint of the substrate W.

Figure 21:
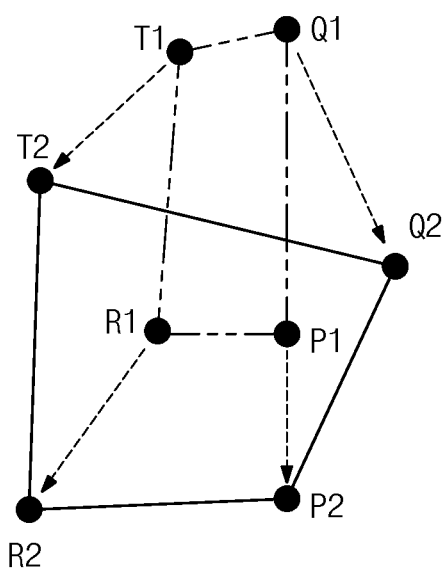
Figure 22:
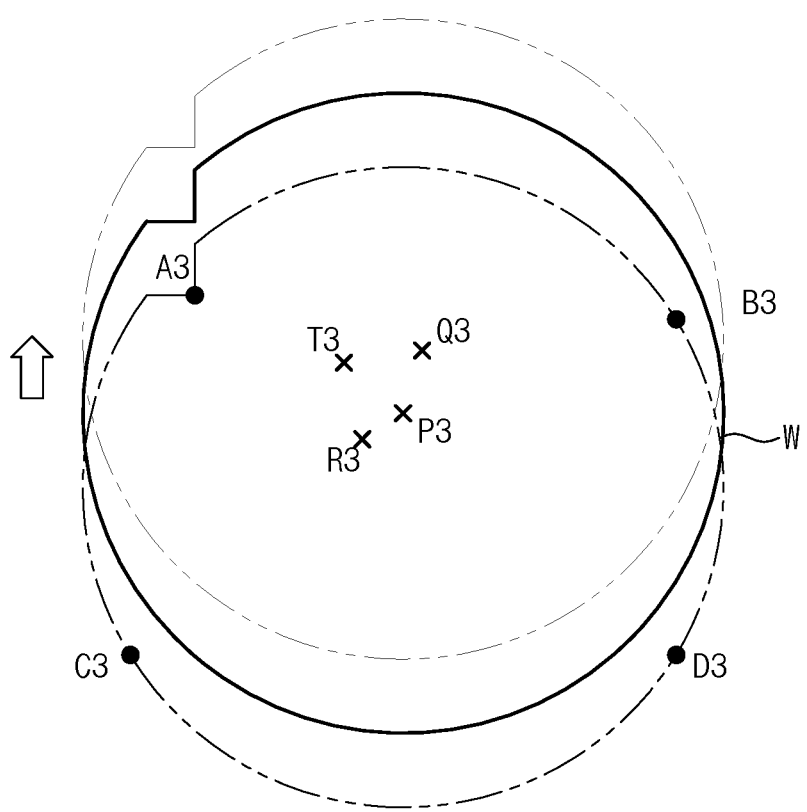

For example, in case of FIG. 21, the midpoints P1 and P2 of the substrate W that have moved with the same status with the movement of the substrate W is calculated as the real midpoint of the substrate W. Also, three edge positions B1, C1, D1 and B2, C2, D2 that have been used to calculate midpoints of P1 and P2 the substrate W are determined as a position that there is no notch on substrate W, but A1 and A2 are determined as a position where notch exists.

Figure 10:
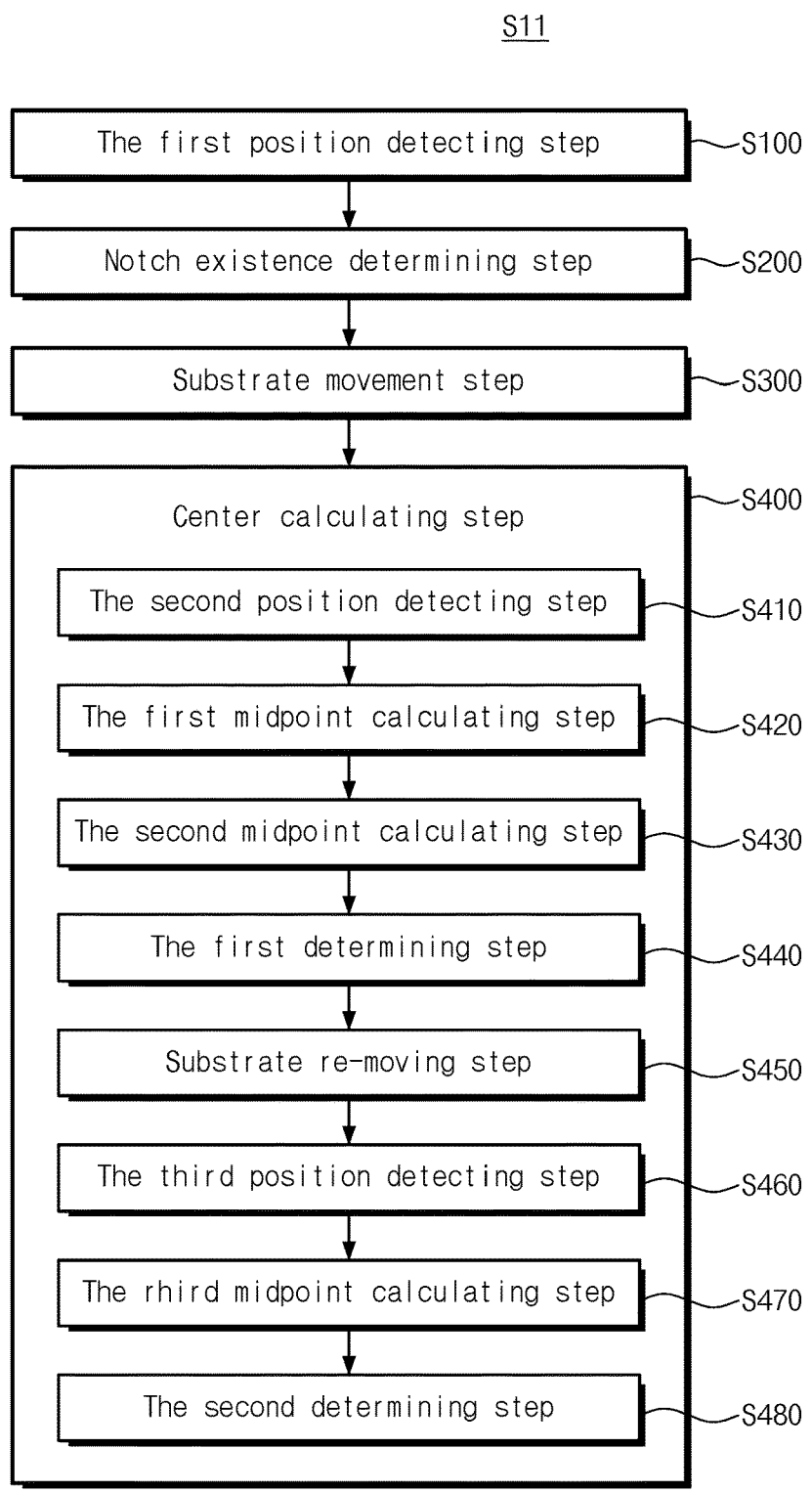
FIG. 10 is a flow chart that shows a substrate center detecting method in accordance with the other embodiment.
Figure 11:
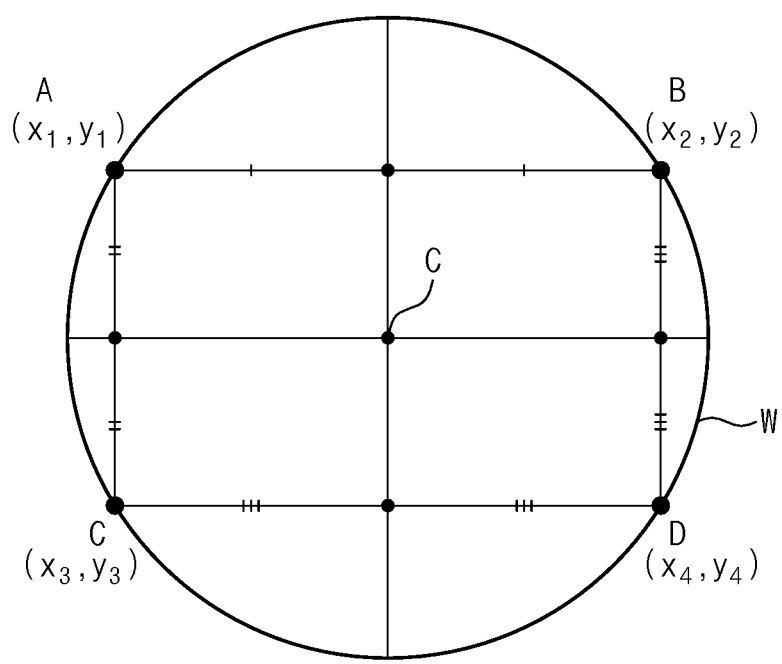
FIG. 11 schematically shows a method for calculating a center of a substrate using four edge positions of a substrate.

FIG. 10 is a flow chart that shows a method for detecting the center of substrate in accordance with an embodiment of the present invention. Referring to FIG. 10, in the center calculating step S400 of the substrate center detecting method S10 of FIG. 9, there may be a case when the center of the substrate may not be calculated in the first determining step S440. This is because a midpoint movement status calculated in considering the notch not be within the predetermined error range so there is a case when the real center of the substrate is not calculated in the first determining step S440.

The substrate center detecting method S11 in accordance with an embodiment of the present invention, when the real center of the substrate W is not calculated in the first determining step S440, the center calculating step S400 further includes, after the first determining step S440, a substrate re-moving step S450, a third position detecting step S460, a third midpoint calculating step S470, and a second determining step S480.

The substrate re-moving step S450 moves the substrate W. In an example, in the substrate re-moving step S450, the substrate W may move to the opposition direction of the predetermined direction set in the substrate movement step S300. In the substrate re-moving step S450, the substrate W may by the half of the predetermined distance set in the substrate movement step S300.

In the third position detecting step S460, four edge positions of substrate W may be redetected by using a position detecting member 550 after the substrate re-moving step S450.

The third midpoint calculating step S470 calculates a midpoint of substrate W by using four edge positions detected in the third position detecting step S460. The third midpoint calculating step S470 may calculate two midpoints M3 and N3 of substrate W. The third midpoint calculating step S470 obtains two midpoints M3 and N3 of the substrate by using two edge positions B1 and C1 corresponding to two edge positions B3 and C3 that has been used to calculate diagonal distance in predetermined range in the first midpoint calculating step S420 and two edge positions A1 and D1 corresponding to two edge positions A3 and D3 that has been used to calculate diagonal distance out of predetermined range, respectively.

Figure 15:
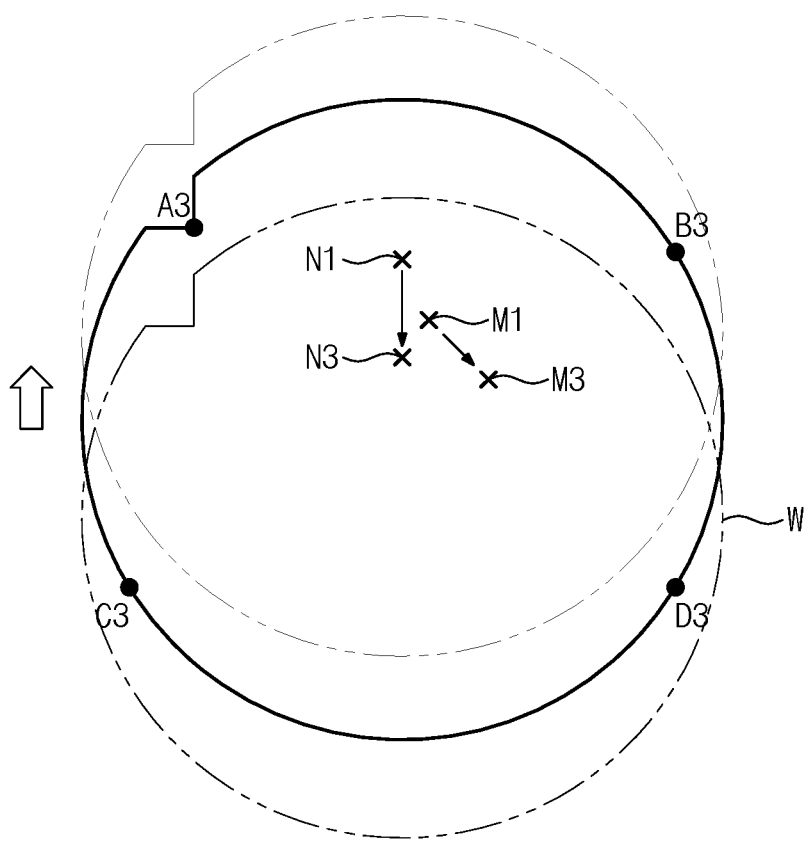

Two edge positions that have been used to calculate diagonal distance which is in the predetermined range in here and corresponding two edge positions refer to detected positions by the same position detecting member 550 before and after movement of substrate W, respectively. In an example, as shown in FIGS. 13 and 15, B1 and C1 positions and B3 and C3 positions detected by the same position detecting member 550 as the B1 and C1 positions detected before movement of substrate W are two edge positions that have been used to calculate diagonal distance which is in the predetermined range and corresponding two edge positions, respectively. Likewise the two edge positions that have been used to calculate diagonal distance which is out of the predetermined range and corresponding two edge positions refer to the detected positions by the same position detecting member 550 before and after movement of substrate W. In an example, as shown in FIGS. 14 and 16, A1 and D1 positions and edge positions A3, D3 detected by the same position detecting member 550 with the A1, D1 positions detected before movement of substrate W are two edge positions that has been used to calculate diagonal distance which is in the predetermined position range and corresponding two edge positions, respectively.

The second determining step S480 may determine a real midpoint of substrate W based on each movement status of midpoints of a substrate calculated in the first midpoint calculating step S420 and the third midpoint calculating step S470 respectively, considering the movement of the substrate W.

In an example, the midpoint which has moved with the same movement status as the substrate W is determined as the real midpoint of the substrate W.

In an example, the real midpoint of the substrate W can be determined based on the direction of the movement. For example, the midpoint which has moved with the same direction as the substrate W is determined as the real midpoint of the substrate W.

In an example, the real midpoint of the substrate W can be determined based on the distance of the movement. For example, the midpoint which has moved with the same direction as the substrate W is determined as the real midpoint of the substrate W.

For example, in case of FIGS. 13 and 15, midpoints N1 and N3 that have moved with the same status with the movement of the substrate W are calculated as the real midpoint of the substrate W. Also, three edge positions B1, C1, D1 and B3, C3, D3 that have been used to calculate midpoints N1 and N3 of the substrate W are determined as a position that there is no notch on substrate W, but A1 and A3 are determined as a position where notch exists.

However, the third midpoint calculating step S470 may calculate a center of a substrate with a different method.

The third midpoint calculating step S470 may calculate a midpoint of substrate W by using three edge positions among four edge positions A3, B2, C3, and D3 detected in the third position detecting step S460. The third midpoint calculating step S430 may obtain four midpoints P3, Q3, T3 and R3 by using four different sets including three edge positions among four detected edge positions A3, B3, C3, and D3 as shown in FIG. 20.

The second determining step S480 may determine a real midpoint of a substrate based on movement status of each calculated midpoint of substrate W in the first midpoint calculating step S420 and the third midpoint calculating step S470 respectively.

Figure 23:
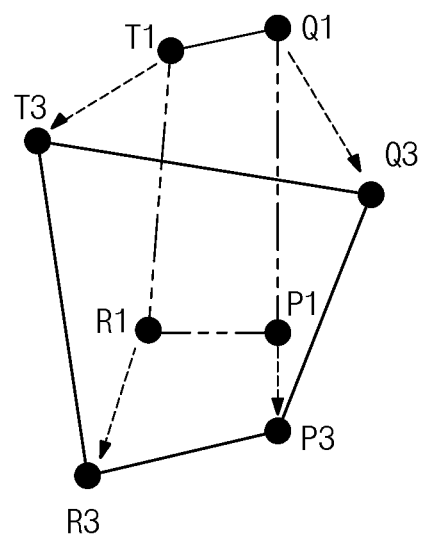

In an example, the midpoint which has moved with the same movement status as the substrate W is determined as the real midpoint of the substrate W. In an example, the real midpoint of the substrate W can be determined based on the direction of the movement. For example, the midpoint which has moved with the same direction as the substrate W is determined as the real midpoint of the substrate W. In an example, the real midpoint of the substrate W can be determined based on the direction of the movement. For example, the midpoint which has moved with the same distance as the substrate W is determined as the real midpoint of the substrate W. For example, in case of FIG. 23, midpoints P1 and P3 that have moved with the same status with the movement of substrate W is calculated as the real midpoint of the substrate W. Also, three edge positions B1, C1, D1 and B3, C3, D3 that have been used to calculate midpoints P1 and P3 of the substrate W are determined as a position that there is no notch on substrate W, but midpoints A1 and A3 are determined as a position where notch exists.

Hereinafter a method for transporting a substrate S1 in accordance with an embodiment of the present invention will be described in detail.

Figure 24:
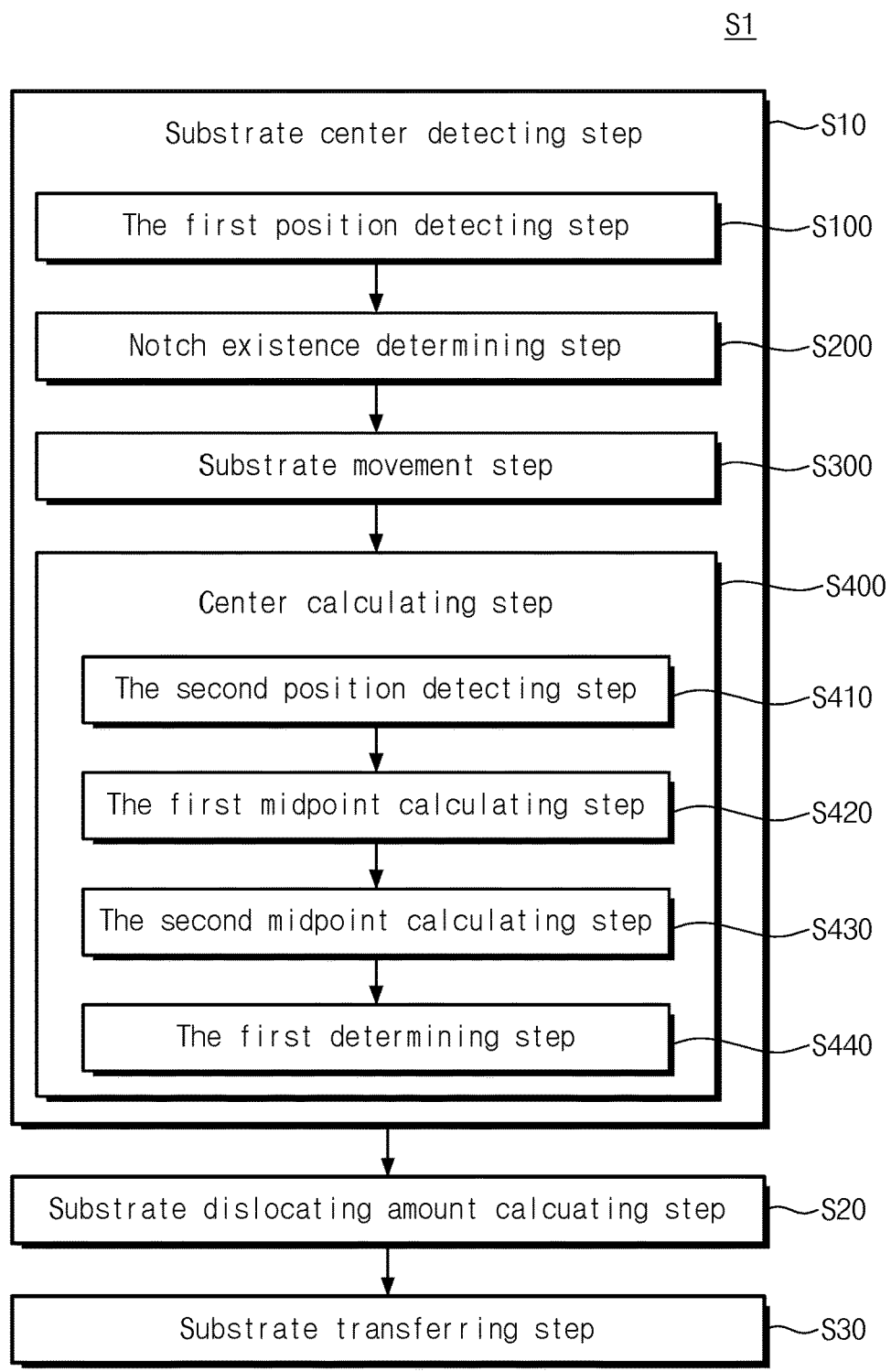
FIG. 24 is a flow chart of a method for transporting a substrate in accordance with an embodiment.

FIG. 24 is a flow chart that shows a method for transporting a substrate S1 in accordance with an embodiment of the present invention.

Referring to FIG. 24, the method for transporting a substrate S1 transports a substrate W based on the calculated amount of dislocation of the substrate W before transporting a substrate W. The method for transporting a substrate S1 includes a substrate center detecting step S10, a substrate dislocation amount calculating step S20, and a substrate transporting step S30.

The substrate center detecting step S10 may perform same process as the method for detecting center of substrate in FIG. 9.

The substrate dislocation amount calculating step S20 calculates the amount of dislocation of a substrate W by comparing the reference center of the substrate W and the center of the substrate W obtained in the substrate center calculating step S10. The reference center of substrate W indicates the center position of substrate W when substrate W is supported on a transfer arm 530 and placed on the right position.

The substrate transporting step S30 may correct the transporting position based on the amount of dislocation of the substrate W obtained in the substrate dislocation amount calculating step S20, and then transports the substrate to the corrected position.

In an example, the transfer arm 530 may transports the substrate W to the target position by correcting the transporting position based on the amount of dislocation.

Hereinafter a method for transporting a substrate S2 in accordance with an embodiment of the present invention will be described in detail.

Figure 25:
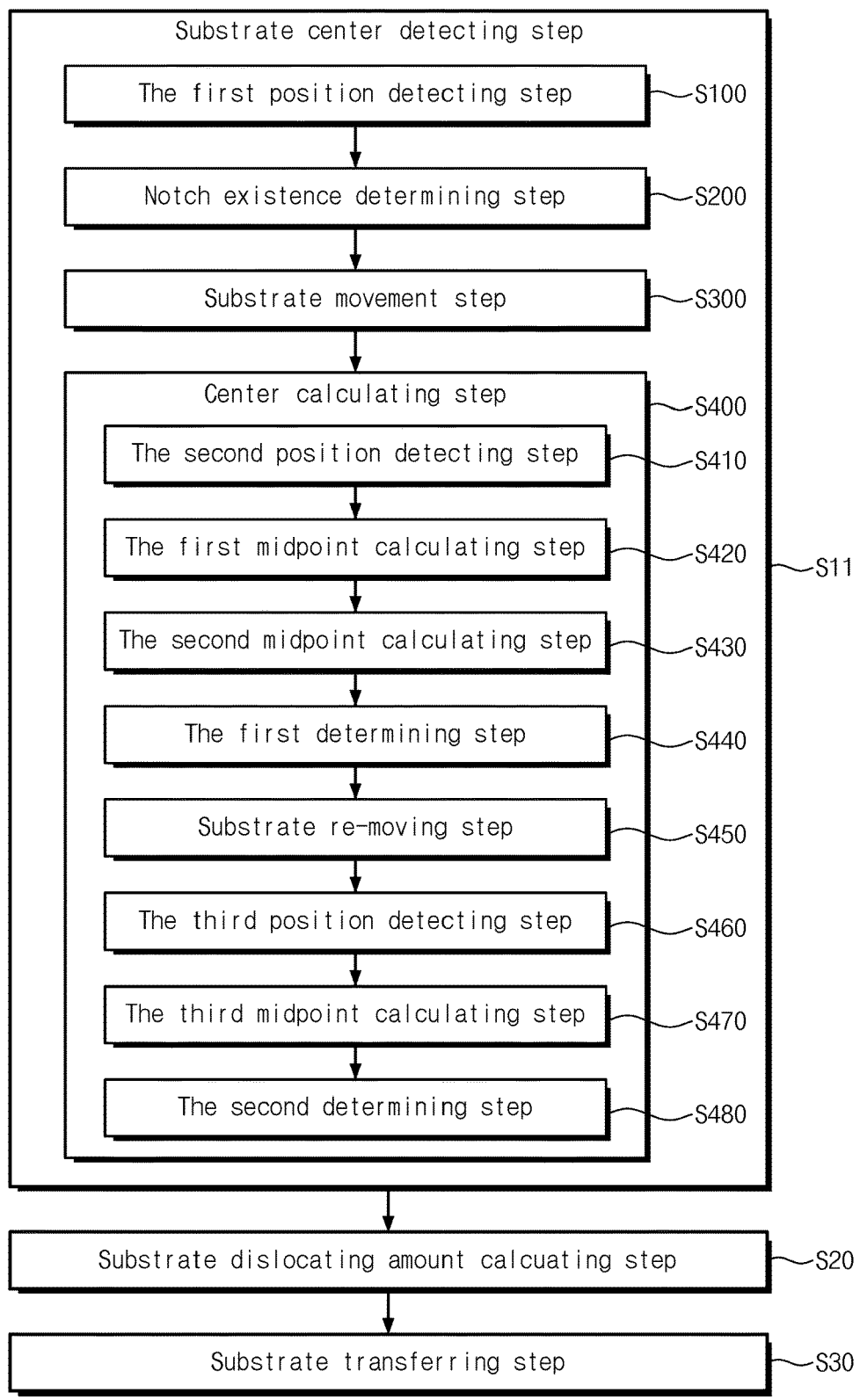
FIG. 25. is a flow chart of a method for transporting a substrate in accordance with the other embodiment.

FIG. 25 is a flow chart that shows a substrate transporting method in accordance with an embodiment of the present invention.

Referring to FIG. 25, the substrate transporting method S2 performs substantially the same processes the substrate W transporting method of FIG. 24. In the substrate transporting method S2 of FIG., the substrate center calculating step S11 performs the same processes as the substrate center calculating step of FIG. 10.

As described above, the present invention may detect correct position of substrate W before transferring substrate W by detecting a real midpoint of substrate W. The midpoint of substrate W can be detected by judging notch among edge positions and excluding notch.

Also, the amount of dislocation can be obtained while the substrate is maintained on the transfer arm 530 by detecting a real midpoint of substrate W, and transport position is corrected based on this, and thus the substrate W can be transported to a desired position.

Foregoing explanations are embodiments of the present invention. Also, described explanations indicate implementation form of the present invention, and the present invention may be used in different combination, alternation and environment. That is, a described concept scope of the present invention disclosed in this application may be changed or corrected within the equal scope of the disclosed explanation and/or inventive concept or those skilled in art. Described embodiments explain the best mode to embody technical idea, and various variations are possible that is requested from the application area and use of the present invention. Therefore, detailed descriptions of the present invention do not intend to limit the scope of the inventive concept. Also, attached scope of claims may be understood to include other implementations.

What is claimed is:

1. A method for detecting a real midpoint of a substrate comprising:
    detecting first four edge positions of the substrate;
    judging whether or not a notch exists among the first four edge positions;
    moving the substrate when it is judged that the notch exists among the first four edge positions;
    calculating the real midpoint of the substrate; and
    transporting the substrate based on the calculated real midpoint,
    wherein calculating the real midpoint comprises:
        detecting second four edge positions of the substrate;
        calculating a first midpoint of three edge positions selected out of the first four edge positions of the substrate;
        calculating a second midpoint of three edge positions selected out of the second four edge positions of the substrate; and
        determining the real midpoint of the substrate based on a moving status of the first midpoint of the substrate and the second midpoint of the substrate as a center of the substrate,
    wherein judging whether or not the notch exists comprises obtaining first four midpoints of four different sets including three edge positions selected from the first four edge positions, and
    wherein it is judged that the notch exists when a sum of distances between the first four midpoints of the substrate is bigger than a predetermined value.

2. The method of claim 1, wherein the first and/or the second midpoints of the substrate, which moved with a same direction as the substrate, are determined as the real midpoint of the substrate.

3. The method of claim 1, wherein the judging comprises:
    calculating each diagonal distance between two edge positions that are located on a diagonal direction of each other among the four edge positions;
    calculating a differential between each of diagonal distances and a diameter of the substrate; and
    judging there is the notch when the differential is bigger than the predetermined value.

4. The method of claim 3, wherein the calculating of the first midpoint includes obtaining two midpoints of the substrate by using two edge positions that have been used to calculate a diagonal distance in a predetermined range in the judging and two edge positions that have been used to calculate a diagonal distance out of the predetermined range, respectively,
    wherein the calculating of the second midpoint includes obtaining each of the two midpoints of the substrate by using two edge positions corresponding to two edge positions that have been used to calculate the diagonal distance in the predetermined range in the judging and two edge positions corresponding to two edge positions that have been used to calculate the diagonal distance out of the predetermined range, respectively, and
    wherein the determining includes determining the real midpoint of the substrate based on each movement status of the first midpoint of the substrate and the second midpoint of the substrate.

5. The method of claim 4, wherein in the calculating, in a case that a center of the substrate is not calculated in the determining, further comprising:
    re-moving the substrate, wherein the re-moving includes:
    re-detecting four edge positions of the substrate;
    calculating two, third midpoints of the substrate by using two edge positions corresponding to two edge positions that have been used to calculate a diagonal distance in the predetermined range in the third position re-detecting and two edge positions corresponding to two edge positions that have been used to calculate a diagonal distance out of the predetermined range respectively; and
    determining the real midpoint of the substrate based on each movement status of the first and third midpoints of the substrate.

6. The method of claim 1,
    wherein calculating the second midpoint includes obtaining second four midpoints of four different sets including three edge positions selected from the second four edge positions of the substrate, and
    wherein the real midpoint of the substrate is determined based on each movement status of the first and second four midpoints of the substrate.

7. The method of claim 6, wherein calculating the real midpoint, in a case that the real midpoint of the substrate is not calculated, further comprises:
    re-moving the substrate;
    detecting third four edge positions of the substrate;
    calculating four third midpoints of different sets including three edge positions selected from the third four edge positions of the substrate; and
    determining the center of the substrate based on a movement status of the first and third four midpoints of the substrate.

8. The method of claim 1, wherein the first and second edge positions of the substrate are detected by four position detecting members, and each of the four position detecting members include a light emitting part that irradiates a light and a light receiving part that receives irradiated light from the light emitting part.

9. The method of claim 8, wherein each position detecting member is a laser displacement sensor.

10. A substrate transporting method comprising:
    calculating a real midpoint of the substrate;
    calculating an amount of dislocation of the substrate by comparing a reference center of the substrate and the calculated real midpoint of the substrate; and transporting the substrate by correcting a transporting position of the substrate based on the calculated amount of dislocation of the substrate, wherein calculating the real midpoint of the substrate comprises:
　detecting first four edge positions of the substrate;
　judging whether or not a notch exists among the first four edge positions;
　moving the substrate when it is determined that the notch exists among the first four edge positions;
　detecting second four edge positions of the substrate;
　calculating a first midpoint of three edge positions out of the first four edge positions of the substrate;
　calculating a second midpoint of three edge positions out of the second four edge positions of the substrate; and
　determining the real midpoint of the substrate based on a moving status of the first and second midpoints of the substrate as a center of the substrate, wherein judging whether or not the notch exists includes obtaining first four midpoints of four different sets including three edge positions selected from the first four edge positions, and wherein it is judged that the notch exists when a sum of distances between the first four midpoints of the substrate is bigger than a predetermined value.

11. The method of claim 10, wherein the first and/or the second midpoints of the substrate, which moved with a same direction as the substrate, are determined as the real midpoint of the substrate.

12. The method of claim 10, wherein the judging comprises:
　calculating each diagonal distance between two edge positions that are located on a diagonal direction of each other of detected four edge positions;
　calculating a differential between each of diagonal distances and a diameter of the substrate; and
　judging there is the notch when the differential is bigger than the predetermined value.

13. The method of claim 12, wherein the calculating a first midpoint includes obtaining each of two midpoints of the substrate by using two edge positions that have been used to calculate a diagonal distance in a predetermined range in the judging and two edge positions that have been used to calculate a diagonal distance out of the predetermined range, respectively, wherein the calculating of the second midpoint includes obtaining each of two midpoints of the substrate by using two edge positions corresponding to two edge positions that have been used to calculate the diagonal distance in the predetermined range in the judging and two edge positions corresponding to two edge positions that have been used to calculate the diagonal distance out of the predetermined range, respectively, and wherein the determining determines the real midpoint of the substrate based on each movement status of the first and second midpoints of the substrate.

14. The method of claim 13, wherein the calculating of the center, in a case that a midpoint of the substrate is not calculated, further comprises:
　re-detecting four edge positions of the substrate;
　calculating each of two third midpoints of the substrate by using two edge positions corresponding to two edge positions that have been used to calculate a diagonal distance in the predetermined range in the re-detecting and two edge positions corresponding to two edge positions that have been used to calculate a diagonal distance out of the predetermined range; and
　determining the real midpoint of the substrate based on each movement status of the first and third midpoints of the substrate.

15. The method of claim 10,
wherein calculating the second midpoint includes obtaining second four midpoints of four different sets including three edge positions selected from the second four edge positions of the substrate, and wherein the real midpoint of the substrate is determined based on each movement status of the first and second four midpoints of the substrate.

16. The method of claim 15, wherein calculating the real midpoint, when the real midpoint of the substrate is not calculated, further comprises:
　re-moving the substrate;
　detecting third four edge positions of the substrate;
　calculating third four midpoints of four different sets including three edge positions selected from the third four edge positions of the substrate; and
　determining the center of the substrate based on each movement status of the first and third four midpoints of the substrate.

17. The method of claim 10, wherein the first and second edge positions of the substrate are detected by four position detecting members, and each of the four position detecting members includes a light emitting part that irradiates a light and a light receiving part that receives irradiated light from the light emitting part.

18. The method of claim 17, wherein each position detecting member is a laser displacement sensor.

\* \* \* \* \*